(12) United States Patent
Shido et al.

(10) Patent No.: US 8,867,301 B2
(45) Date of Patent: Oct. 21, 2014

(54) SEMICONDUCTOR DEVICE HAVING LATENCY COUNTER TO CONTROL OUTPUT TIMING OF DATA AND DATA PROCESSING SYSTEM INCLUDING THE SAME

(71) Applicant: PS4 Luxco S.a.r.l., Luxembourg (LU)

(72) Inventors: Taihei Shido, Tokyo (JP); Chiaki Dono, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 25 days.

(21) Appl. No.: 13/624,444

(22) Filed: Sep. 21, 2012

(65) Prior Publication Data

US 2013/0094321 A1    Apr. 18, 2013

(30) Foreign Application Priority Data

Sep. 21, 2011  (JP) ................. 2011-205739

(51) Int. Cl.
| | |
|---|---|
| G11C 8/00 | (2006.01) |
| G11C 7/10 | (2006.01) |
| G11C 8/10 | (2006.01) |
| G11C 11/4076 | (2006.01) |

(52) U.S. Cl.
CPC .. G11C 8/10 (2013.01); G11C 7/10 (2013.01); G11C 11/4076 (2013.01); G11C 2207/2272 (2013.01)
USPC .................... 365/230.06; 365/233.1; 365/236; 365/233.11; 365/194; 365/233.13

(58) Field of Classification Search
CPC .................. G11C 11/4076; G11C 2207/2272; G11C 5/063; G11C 7/1045; G11C 7/222; G11C 7/22
USPC ............ 365/233.1, 236, 230.06, 233.11, 194, 365/233.13
See application file for complete search history.

(56) References Cited

U.S. PATENT DOCUMENTS

| | | | |
|---|---|---|---|
| 8,164,372 B2 | 4/2012 | Mitsubori et al. | |
| 8,208,340 B2 | 6/2012 | Fujisawa | |
| 2011/0058445 A1 | 3/2011 | Fujisawa | |
| 2011/0062998 A1 | 3/2011 | Mitsubori et al. | |
| 2012/0120754 A1* | 5/2012 | Fujisawa | 365/233.1 |

FOREIGN PATENT DOCUMENTS

| | | |
|---|---|---|
| JP | 2011060353 A | 3/2011 |
| JP | 2011060385 A | 3/2011 |

* cited by examiner

*Primary Examiner* — Thong Q Le

(57) ABSTRACT

Disclosed herein is a device that includes a command decoder and a latency counter. The command decoder generates a first internal command in response to a first internal clock signal. The latency counter includes: a gate control signal generation unit generating output gate signals in response to a second internal clock signal; delay circuits each receiving an associated one of the output gate signals and generating an associated one of input gate signals; and a command signal latch unit fetching the first internal command in response to one of the input gate signals and outputting the first internal command in response to one of the output gate signals. Each of the delay circuits includes a first delay element that operates on a first power supply voltage and a second delay element that operates on a second power supply voltage different from the first power supply voltage.

20 Claims, 15 Drawing Sheets

SEMICONDUCTOR DEVICE HAVING LATENCY COUNTER TO CONTROL OUTPUT TIMING OF DATA AND DATA PROCESSING SYSTEM INCLUDING THE SAME

BACKGROUND OF THE INVENTION

1. Field of the Invention

The present invention relates to a semiconductor device, and particularly to a semiconductor device that controls output timing of data using a latency counter. The present invention also relates to a data processing system including such a semiconductor device.

2. Description of Related Art

Synchronous memory devices represented by a synchronous DRAM (Synchronous Dynamic Random Access Memory) are widely used as a main memory or the like of personal computers. In the synchronous memory device, data is inputted and outputted in synchronism with a clock signal supplied from a controller. Thus, when a higher-speed clock signal is used, the data transfer rate can be increased.

However, because a DRAM core is consistently operated by an analog operation also in the synchronous DRAM, a considerably weak charge needs to be amplified by a sensing operation. Accordingly, it is not possible to shorten the time from issuing a read command to outputting first data. After the elapse of a predetermined delay time from the read command is issued, the first data is outputted in synchronism with an external clock signal.

This delay time is generally called "CAS latency" and is set to an integral multiple of a clock cycle. For example, in case the CAS latency is 7 (CL=7), the first data is outputted in synchronism with the external clock signal seven cycles after fetching the read command in synchronism with the external clock signal. That is, the first data is outputted after the elapse of the seven clock cycles.

Desired CAS latency is realized by the latency counter. The latency counter is a circuit that receives an internal read command MDRDT from a command decoder, and generates an internal read command DRC by delaying the command MDRDT by a period of time corresponding to the CAS latency. More specifically, the latency counter first generates an output gate signal COT, which is in synchronism with an internal clock signal LCLK supplied from a DLL circuit (phase synchronizing circuit); and an input gate signal CIT, which is generated by delaying the output gate signal COT. The output gate signal COT and the input gate signal CIT, respectively, are made up of eight-line signals; and are so configured that each line is sequentially activated for each clock cycle. When the internal read command MDRDT is supplied, the latency counter accepts the internal read command MDRDT in synchronism with the activated line signal of input gate signal CIT. Each line signal of the input gate signal CIT is associated in advance with each line signal of the output gate signal COT on a one-to-one basis. The latency counter waits until the next activation of the line signal of the output gate signal COT corresponding to the input gate signal CIT that is used to accept the internal read command MDRDT takes place. Then, in response to the activation of the output gate signal COT, the latency counter starts activating the internal read command DRC. The CAS latency is realized by the waiting period during the above process. An output circuit outputs read data to the outside in synchronization with the internal read command DRC that has become activated as described above. An example of the latency counter is disclosed in Japanese Patent Application Laid-Open No. 2011-60353.

As for a semiconductor device including a synchronous memory device, there is a semiconductor device that uses, as power source used for operating some circuits, an internal voltage that is generated by lowering an external voltage, thereby reducing power consumption. For example, there is disclosed in Japanese Patent Application Laid-Open No. 2011-60385 an example in which an internal voltage VPERI is generated from an external voltage VDD and an external voltage VSS to operate some peripheral circuits of DRAM.

However, when the internal voltage is used in a semiconductor device that uses a latency counter, there is a possibility that the margin (or latch margin of the latency counter) decreases at a time when the internal read command MDRDT is accepted in synchronism with the input gate signal CIT, and the process of accepting the internal read command MDRDT could fail as a result. The mechanism will be described below in detail.

As described above, the internal clock signal LCLK is generated by a DLL circuit. The DLL circuit is so formed as to contain a feedback circuit, which is so adjusted as to cause a delay amount equivalent to that of the output circuit, and a control circuit, which adjusts the internal clock signal LCLK in such a way that the output timing of the feedback circuit is in synchronism with an internal clock signal PreCLK, which is described later. Therefore, the phase of the internal clock signal LCLK varies according to the delay time of the feedback circuit.

Meanwhile, the internal read command MDRDT is generated by a command decoder. The command decoder receives a read command READ supplied from a command input circuit, which receives the read command READ; generates an internal read command MDRDT based on the read command READ; and then outputs the internal read command MDRDT in synchronism with an internal clock signal ICK, which is described below.

The internal clock signal PreCLK and the internal clock signal ICK, respectively, are generated as described below. That is, a clock input circuit that receives an external clock signal generates the internal clock signal PreCLK based on the external clock signal. To the DLL circuit, the internal clock signal PreCLK is supplied. The internal clock signal PreCLK is also supplied to a timing generation circuit, where the internal clock signal PreCLK is converted to an internal clock signal ICK. To the command decoder, the internal clock signal ICK is supplied.

When the internal voltage is used, among the circuits that have so far been described, the DLL circuit, the command decoder, the timing generation circuit, and the latency counter are so formed as to operate only on the internal voltage in principle in order to reduce power consumption.

By contrast, the clock input circuit and the command input circuit are so formed as to contain a circuit that operates on external voltage even when the internal voltage is used. The reason is that these circuits need to accept a signal whose amplitude value is equal to that of the external voltage from the outside. The feedback circuit in the DLL circuit also contains, as an exception, a circuit that operates on external voltage. The reason is that an output circuit that outputs read data to the outside inevitably contains a circuit that operates on external voltage.

Here, suppose that a change in external voltage has occurred. Then, a change in phase occurs at least in the following signals among the clock signals that have so far been described: the internal clock signal PreCLK and the internal clock signal LCLK. The reason is that the clock input circuit and the DLL circuit, which are used to generate the internal clock signal PreCLK and the internal clock signal LCLK, contain a circuit that operates on external voltage.

The internal clock signal PreCLK is common to the internal read command MDRDT and the input gate signal CIT. Therefore, even when a change in phase occurs, there is no effect at least on the latch margin of the latency counter. By contrast, if a change in phase of the internal clock signal LCLK occurs, a change in phase occurs only in the input gate signal CIT, and no change in phase in the internal read command MDRDT. As a result, a difference in phase occurs between the internal read command MDRDT and the input gate signal CIT, leading to a decline in the latch margin of the latency counter.

As described above, when a change in external voltage occurs, a change in phase of the input gate signal CIT occurs while the internal read command MDRDT does not change. As a result, the latch margin of the latency counter decreases. In some cases, the process of accepting the internal read command MDRDT could fail. Therefore, a technology for curbing a decline in the latch margin that is associated with a change in external voltage is desired.

SUMMARY

In an aspect of this disclosure, there is provided a device comprising: a command decoder and a latency counter. The command decoder generates a first internal command in response to a first internal clock signal. The latency counter includes; a gate control signal generation unit generating a plurality of output gate signals in response to a second internal clock signal, a plurality of delay circuits each receiving an associated one of the output gate signals and generating an associated one of a plurality of input gate signals, and a command signal latch unit fetching the first internal command in response to one of the input gate signals and outputting the first internal command as a second internal command in response to one of the output gate signals. Each of the delay circuit includes a first delay element that operates on a first power supply voltage and a second delay element that operates on a second power supply voltage. The first power supply voltage is different from the second power supply voltage.

In another aspect of this disclosure, there is provided a device comprising: a command decoder, a clock generating circuit and a latency counter. The command decoder operates on an internal power supply voltage and generates a first internal command. The clock generating circuit generates a first internal clock signal and includes a first circuit portion operating on the internal power supply voltage and a second circuit portion operating on an external power supply voltage. The latency counter includes; a gate control signal generation unit generating a plurality of output gate signals in response to a first internal clock signal, a plurality of delay circuits each receiving an associated one of the output gate signals and generating an associated one of a plurality of input gate signals, and a command signal latch unit fetching the first internal command in response to one of the input gate signals and outputting the first internal command as a second internal command in response to one of the output gate signals. Each of the delay circuit has a delay time that changes in response to variations of both of the internal and external power supply voltages.

DETAILED DESCRIPTION OF THE EMBODIMENTS

Preferred embodiments of the present invention will be explained below in detail with reference to the accompanying drawings.

Figure 1:
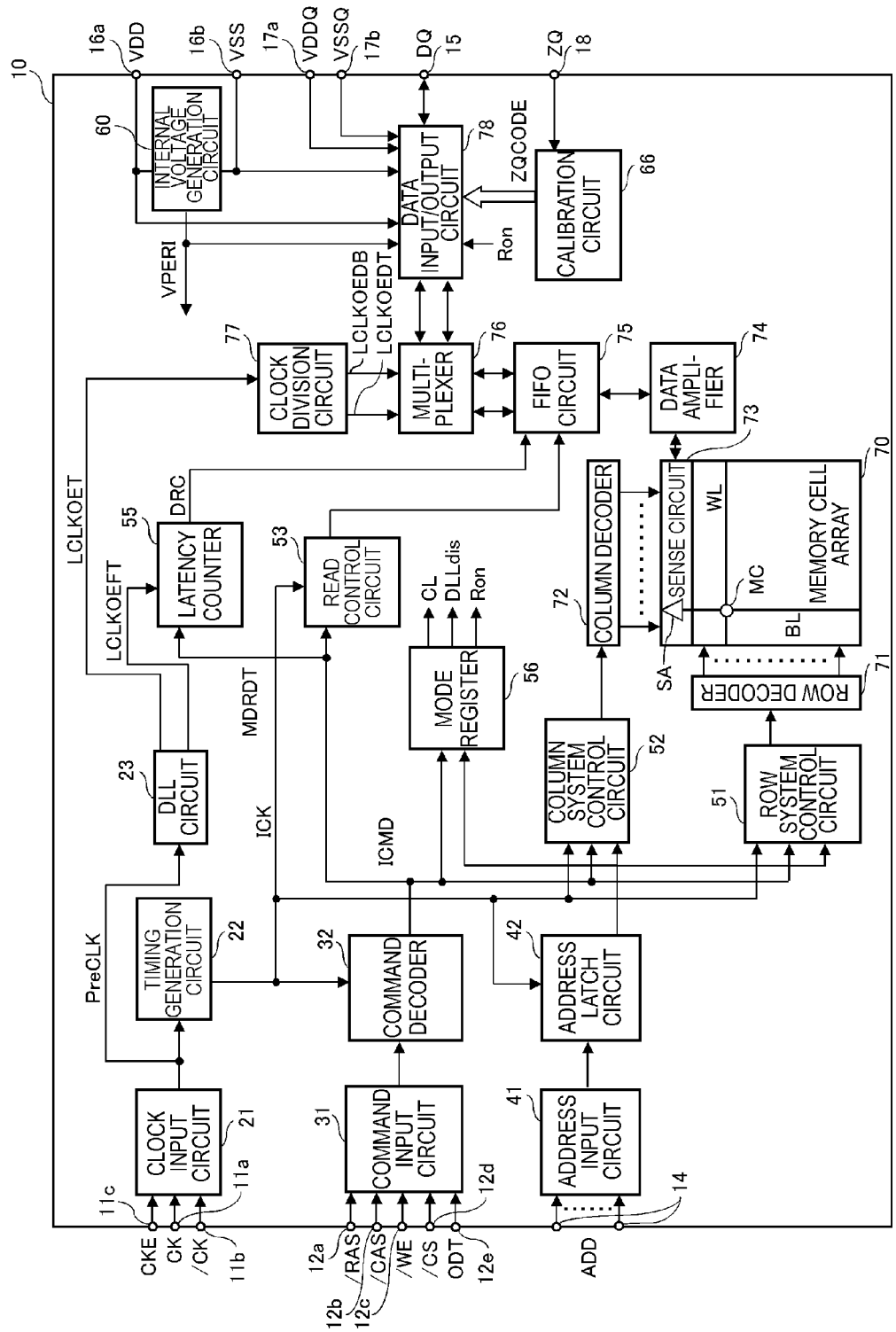
FIG. 1 is a block diagram showing the overall configuration of a semiconductor device 10 according to a first preferred embodiment of the present invention.

Referring now to FIG. 1, the semiconductor device 10 of the present embodiment is a synchronous DRAM, and includes the following external terminals: clock terminals 11a and 11b; a clock enable terminal 11c; command terminals 12a to 12e; address terminals 14; a data input/output terminal 15; power supply terminals 16a, 16b, 17a, and 17b; and a calibration terminal 18.

The clock terminals 11a and 11b are terminals to which external clock signals CK and /CK are respectively supplied. The clock enable terminal 11c is a terminal to which a clock enable signal CKE is input. The supplied external clock signals CK and /CK and clock enable signal CKE are supplied to a clock input circuit 21. In the present specification, a signal whose name starts with "/" means an inverted signal of a corresponding signal, or a low-active signal. Accordingly, the clock signals CK and /CK are complementary to each other. An input clock signal PreCLK, which is output from the clock input circuit 21, is supplied to a timing generation circuit 22 and a DLL circuit 23 (phase synchronizing circuit). The timing generation circuit 22 plays a role in generating an internal clock signal ICK based on the internal clock signal PreCLK and supplying the internal clock signal ICK to various internal circuits except circuits of a data output system. The DLL circuit 23 plays a role in generating an internal clock signal LCLKOET (first internal clock signal) and an internal clock signal LCLKOEFT (second internal clock signal), and supplying the internal clock signal LCLKOET to each circuit of the data output system, and the internal clock signal LCLKOEFT to a latency counter 55. Incidentally, the internal clock signal LCLKOEFT is a signal that is output by splitting the internal clock signal LCLKOET inside the DLL circuit 23, and thus the internal clock signal LCLKOEFT is the same signal as the internal clock signal LCLKOET in principle. However, a delay circuit may be provided inside the DLL circuit 23 so that the phase of the internal clock signal LCLKOEFT is different from the phase of the internal clock signal LCLKOET.

The DLL circuit 23 has a function of controlling the phase of the internal clock signal LCLKOET based on the clock signals CK and /CK. More specifically, when a data input/output circuit 78, which is described later, outputs read data DQ from the data input/output terminal 16 in synchronization with the internal clock signal LCLKOET, the DLL circuit 23 controls the phase of the internal clock signal LCLKOET in such a way that the phase of the read data DQ at the data input/output terminal 16 is aligned with the phase of the clock signals CK and /CK. The DLL circuit 23 will be described later in more detail.

Incidentally, the DLL circuit 23 is not necessarily used constantly. Whether or not the DLL circuit 23 is used is selected depending on what is set in a mode register 56. That is, when "DLL ON mode" is set in the mode register 56, the DLL circuit 23 is used; the phase control of the internal clock signal LCLKOET is performed relative to the clock signals CK and /CK. When "DLL OFF mode" is set in the mode register 56, the DLL circuit 23 is not used; the phase control of the internal clock signal LCLKOET is not performed relative to the clock signals CK and /CK. The control by the mode register 56 of the DLL circuit 23 is performed by a mode signal DLLdis.

The command terminals 12a to 12e are terminals to which the following signals are respectively supplied: a row address strobe signal /RAS; a column address strobe signal /CAS; a write enable signal /WE; a chip select signal /CS; and an on-die termination signal ODT. The above command signals are supplied to a command decoder 32 via a command input circuit 31. The command decoder 32 is a circuit that generates various internal commands ICMD by retaining, decoding, and counting command signals, or by performing other operations. The generated internal commands ICMD are signals that are in synchronization with the internal clock ICK. If a command signal is a signal that is recognized as a read command READ, the command decoder 32 generates, as an internal command ICMD, an internal read command MDRDT (first internal read command).

The internal commands ICMD generated by the command decoder 32 are supplied to a row system control circuit 51, a column system control circuit 52, a read control circuit 53, the latency counter 55, the mode register 56, and the like. Among various internal commands ICMD, the internal read command MDRDT is supplied at least to the latency counter 55 and the read control circuit 53.

The latency counter 55 is a circuit that generates an internal read command DRC (second internal read command) by delaying the internal read command MDRDT. The amount of delay is so determined as to allow read data DQ to be output after CAS latency CL, which is set in advance in the mode register 56, has passed since the read command READ is supplied to the command input circuit 31. In this case, while the internal read command MDRDT is a signal that is in synchronization with the internal clock ICK, the internal read command DRC, which is output from the latency counter 55, needs to be in synchronization with the internal clock signal LCLKOET. For this, the latency counter 55 outputs the internal read command DRC in synchronization with the internal clock signal LCLKOEFT. That is, the latency counter 55 also plays a role in switching the clock that is to be synchronized with the internal read command MDRDT from the internal clock ICK to the internal clock signal LCLKOEFT. The latency counter 55 will be described later in more detail.

The address terminals 14 are terminals to which address signals ADD are supplied. The address signals ADD supplied to the address terminals 14 are supplied to an address latch circuit 42 via an address input circuit 41. The address latch circuit 42 is a circuit that latches address signals ADD in synchronization with the internal clock ICK.

The address signals ADD usually are signals for specifying one or a plurality of memory cells in a memory cell array 70. In the memory cell array 70, a plurality of word lines WL and a plurality of bit lines BL cross each other; at the intersection points, memory cells MC are disposed. In a sense circuit 73, which is disposed next to the memory cell array 70, sense amplifiers SA are provided for each bit line BL; a plurality of bit lines BL each are connected to the corresponding sense amplifiers SA in the sense circuit 73. Incidentally, FIG. 1 only shows one word line WL, one bit line BL, one sense amplifier SA, and one memory cell MC. The address signals ADD are so formed as to contain a row address, which specifies a word line WL, and a column address, which specifies a bit line BL (sense amplifier SA). Among the address signals ADD latched by the address latch circuit 42, the row address is supplied to the row system control circuit 51, and the column address to the column system control circuit 52.

The address signals ADD at a time when an entry has been made in the mode register set turn out to be signals that represent a predetermined kind of information corresponding to a command signal that is input during the same period, and does not represent a memory cell. In this case, the address signals ADD latched by the address latch circuit 42 are supplied to the mode register 56.

The row system control circuit 51 is a circuit that supplies a row address to a row decoder 71. The row system control circuit 51 stores a row address indicating a defective word line and a row address indicating a redundant word line in such a way that the row addresses are associated with each other. When a row address is supplied from the address latch circuit 42, the row system control circuit 51 makes a determination as to whether or not the row address supplied is the same as the row address stored indicating a defective word line. If it is determined that the row addresses are not the same, the row system control circuit 51 supplies the row address supplied from the address latch circuit 42 to the row decoder 71 as is. If it is determined that the row addresses are the same, the row system control circuit 51 supplies a row address indicating a redundant word line that is so stored as to be associated with the row address supplied from the address latch circuit 42 to the row decoder 71.

The row decoder 71 is a circuit that selects, from among a plurality of word lines WL in the memory cell array 70, a word line WL corresponding to a row address supplied from the row system control circuit 51.

The column system control circuit 52 is a circuit that supplies a column address to a column decoder 72. The column system control circuit 52 stores a column address indicating a defective bit line and a column address indicating a redundant bit line in such a way that the column addresses are associated with each other. When a column address is supplied from the address latch circuit 42, the column system control circuit 52 makes a determination as to whether or not the column address supplied is the same as the column address stored indicating a defective bit line. If it is determined that the column addresses are not the same, the column system control circuit 52 supplies the column address supplied from the address latch circuit 42 to the column decoder 72 as is. If it is determined that the column addresses are the same, the column system control circuit 52 supplies a column address indicating a redundant bit line that is so stored as to be associated with the column address supplied from the address latch circuit 42 to the column decoder 72.

The column decoder 72 is a circuit that selects a sense amplifier SA connected to a bit line BL corresponding to a column address supplied from the column system control circuit 52, among a plurality of bit lines BL in the memory cell array 70. The sense amplifier SA selected by the column decoder 72 is then connected to a data amplifier 74.

The calibration terminal 18 is a terminal to which an external resistor for calibration (not shown) is connected; and is connected to a calibration circuit 66. The calibration circuit 66 includes a replica buffer having the same circuit configuration as a unit buffer in the data input/output circuit 78, which is described later. The impedance of one unit buffer is preset, for example, to 240 Ω. However, the impedance could vary slightly according to changes in outside temperature, power supply voltage, and other factors. The calibration circuit 66 is a circuit that generates an impedance code ZQCODE to cancel the variation, and supplies the impedance code ZQCODE to the data input/output circuit 78.

The external resistor (not shown) connected to the calibration terminal 18 is a resistor that has the same impedance as the designed value (for example 240 Ω) of the impedance of a unit buffer. The calibration circuit 66 performs an operation (calibration operation) of matching the resistance value of the external resistor and the impedance of the replica buffer, thereby generating an impedance code ZQCODE.

The data input/output terminal 15 is a terminal used for outputting read data DQ and inputting write data DQ, and is connected to a data input/output circuit 78. The data input/output circuit 78 is connected to the data amplifier 74 via a multiplexer 76 and a FIFO circuit 75. In a read operation, a plurality of read data sets DQ prefetched from the memory cell array 70 to the FIFO circuit 75 is output in burst mode from the data input/output terminal 16 via the multiplexer 76 and the data input/output circuit 78. In a write operation, a plurality of write data sets DQ, which are input in burst mode to the data input/output terminal 16, are prefetched by the FIFO circuit 75 via the data input/output circuit 78 and the multiplexer 76, and then written to the memory cell array 70 at the same time.

The impedance of the data input/output circuit 78 is set in advance in the mode register 56. The set value is supplied, as an impedance setting code Ron, from the mode register 56 to the data input/output circuit 78. The data input/output circuit 78 includes a function of adjusting the impedance of itself in accordance with the impedance setting code Ron.

An operation of the FIFO circuit 75 at the time of reading is controlled by the read control circuit 53. The read control circuit 53 is a circuit that instructs the FIFO circuit 75 to output read data DQ in synchronization with the internal clock signal ICK in response to the internal read command MDRDT supplied from the command decoder 32. To the FIFO circuit 75, the internal read command DRC generated by the latency counter 55, too, is supplied. After being instructed by the read control circuit 53 to output read data DQ, the FIFO circuit 75 starts outputting read data DQ in synchronization with the internal read command DRC.

The multiplexer 76 is so formed as to operate in synchronization with the complementary internal clock signals LCLKOEDT and LCLKOEDB that are supplied from a clock division circuit 77. The clock division circuit 77 is a circuit that receives the internal clock signal LCLKOET supplied from the DLL circuit 23, and generates the complementary internal clock signals LCLKOEDT and LCLKOEDB based on the internal clock signal LCLKOET.

Figure 2:
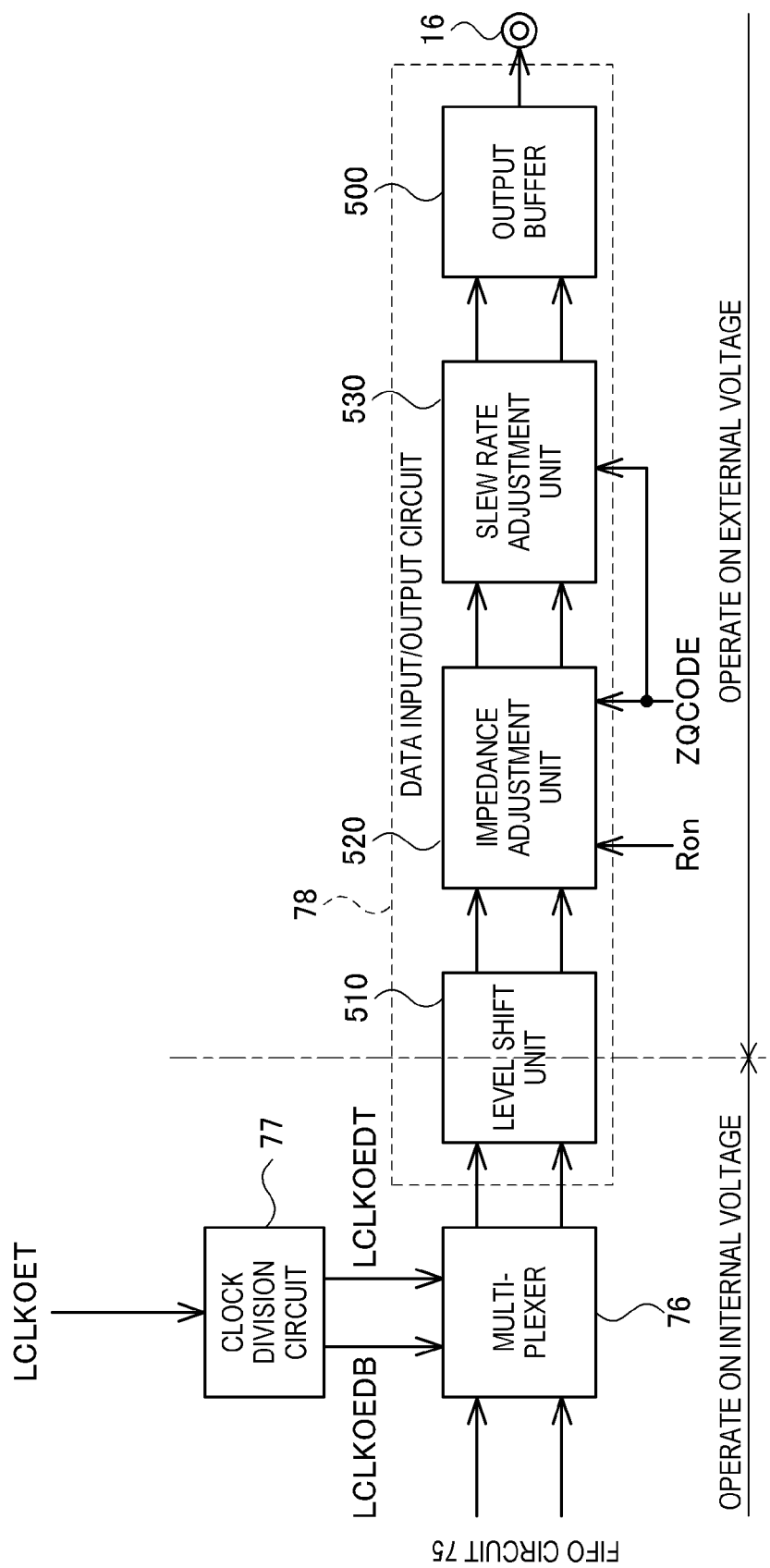
FIG. 2 is a block diagram showing the configuration of the data input/output circuit 78 (output circuit) shown in FIG. 1 as well as the clock division circuit 77 and the multiplexer 76.

As shown in FIG. 2, the data input/output circuit 78 (output circuit) includes an output buffer 500, a level shift unit 510, an impedance adjustment unit 520, and a slew rate adjustment unit 530.

Although not shown in the diagram, the output buffer 500 includes a plurality of unit buffers, which are connected in parallel to the data input/output terminal 16. The read data DQ are simultaneously output from one or a plurality of unit buffers selected by the impedance adjustment unit 520, which is described later, from among a plurality of the above unit buffers. As described above, the unit buffers each are so formed as to have a predetermined impedance (e.g. 240 Ω). Therefore, based on the number of unit buffers selected by the impedance adjustment unit 520, it is possible to change the impedance of the output buffer 500. For example, if four unit buffers are selected, then the impedance of the output buffer 500 is 60 Ω (=240 Ω/4). If six unit buffers are selected, the impedance of the output buffer 500 is 40 Ω (=240 Ω/6).

The level shift unit 510 is a circuit that converts the amplitude value of an input signal from VPERI to VDD. As shown in FIG. 2, the multiplexer 76 is so formed as to operate on the internal voltage VPERI while the impedance adjustment unit 520, the slew rate adjustment unit 530, and the output buffer 500 are so formed as to operate on the external voltage VDD (external voltage VDDQ). Accordingly, when the output signals of the former (output signals of the multiplexer 76) are supplied to the latter, the amplitude values need to be converted from VPERI to VDD. The level shift unit 510 is provided to carry out the conversion.

The impedance adjustment unit 520 includes a function of selecting one or a plurality of unit buffers from among the unit buffers in the output buffer 500 based on an impedance setting code Ron supplied from the mode register 56, and supplying read data DQ to the selected unit buffers. As a result, the impedance of the output buffer 500 is set to a value specified by the impedance setting code Ron.

The impedance adjustment unit 520 also includes a function of bringing the impedance of each unit buffer to a designed value (e.g. 240 Ω) based on an impedance code ZQCODE. Because of the function, for example, even if there is a change in outside temperature or power supply voltage, the impedance of each unit buffer can be set to the designed value.

The slew rate adjustment unit 530 is a circuit that adjusts the slew rate of each unit buffer based on the above-described impedance code ZQCODE. The reason why the slew rate of a unit buffer can be adjusted based on the impedance code ZQCODE is described below. That is, the reason why the actual impedance of a unit buffer can be higher than a designed value is that the performance of transistors that make up the unit buffer could be lower than a designed value. In such a case, the slew rate of the unit buffer tends to drop below the designed value. In this case, by raising the slew rate of the unit buffer, it is possible to bring the slew rate closer to the designed value. Conversely, the reason why the actual impedance of a unit buffer can be lower than a designed value is that the performance of transistors that make up the unit buffer could be higher than a designed value. In such a case, the slew rate of the unit buffer tends to rise above the designed value. In this case, by decreasing the slew rate of the unit buffer, it is possible to bring the slew rate closer to the designed value.

Given the above, the slew rate adjustment unit 530 raises the slew rate of each unit buffer as the impedance indicated by the impedance code ZQCODE, which has not yet been adjusted, increases. The slew rate adjustment unit 530 lowers the slew rate of each unit buffer as the impedance indicated by the impedance code ZQCODE, which has not yet been adjusted, decreases.

Returning to FIG. 1, the power supply terminals 16a and 16b are terminals to which an external voltage VDD (first power supply voltage) and an external voltage VSS are respectively supplied; and are connected to an internal voltage generation circuit 60 and the data input/output circuit 78. The internal voltage generation circuit 60 is a circuit that generates an internal voltage VPERI (second power supply voltage) and other various internal voltages from the external voltages VDD and VSS. The internal voltage VPERI is lower than the external voltage VDD.

The power supply terminals 17a and 17b are terminals to which an external voltage VDDQ and an external voltage VSSQ are respectively supplied; and are connected to the data input/output circuit 78. The potential of the external voltage VDDQ and the potential of the external voltage VSSQ are equal to the potential of the external voltage VDD and the potential of the external voltage VSS, respectively. The reason why the external voltage VDDQ and the external voltage VSSQ are supplied besides the external voltage VDD and the external voltage VSS is to prevent noise from spreading via power supply lines.

The above has described the overall configuration of the semiconductor device 10 according to the present embodiment. The present embodiment is characterized by a process of canceling, in the latency counter 55, variations in phase of the internal clock signal LCLKOEFT resulting from a change in the external voltage VDD. As described above, the internal clock signal LCLKOEFT is a signal that is supplied from the DLL circuit 23 to the latency counter 55. Accordingly, hereinafter, first the configuration of the DLL circuit 23 will be described in detail. Then, the configuration of the latency counter 55 will be described in detail.

Figure 3:
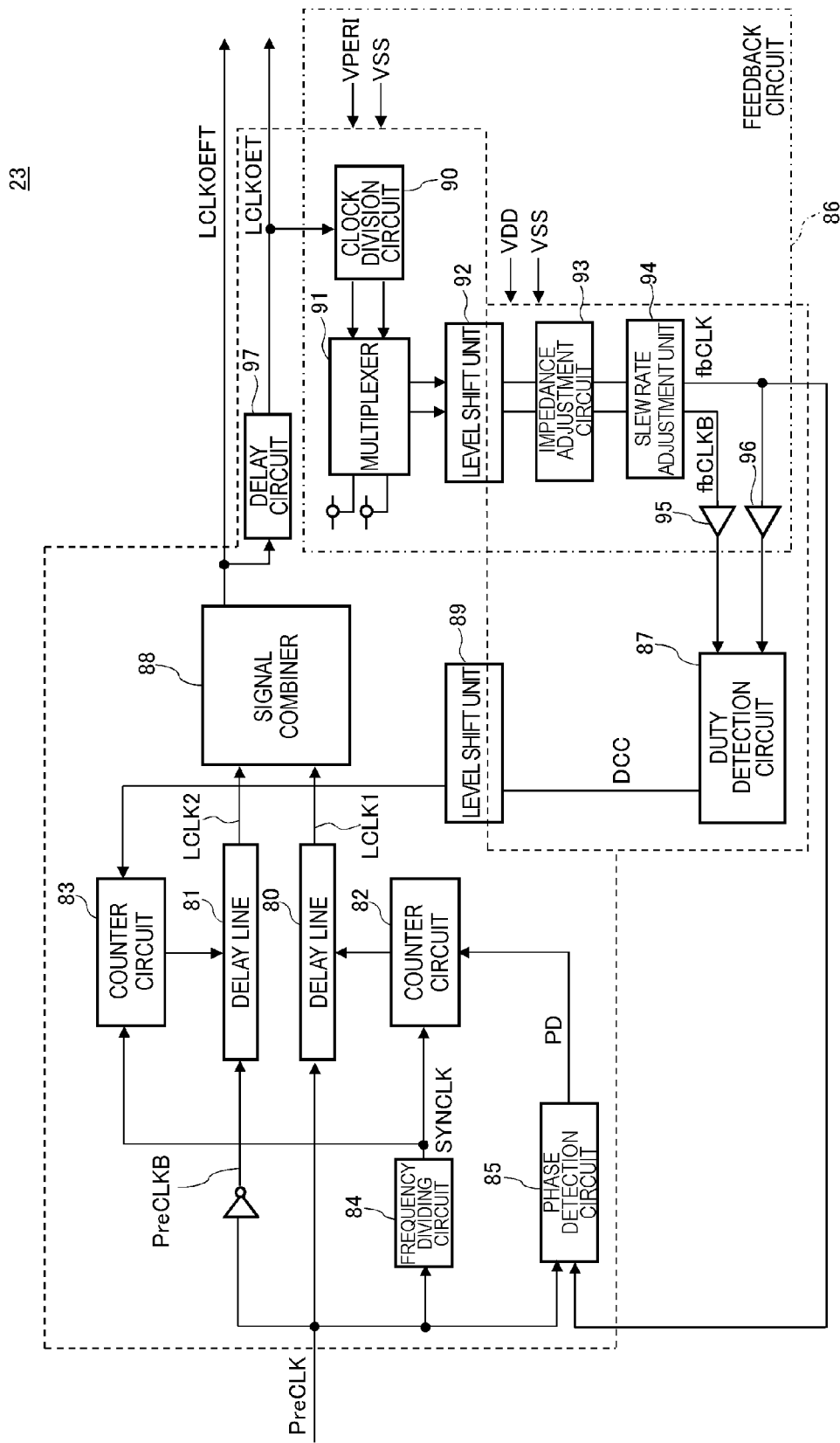
FIG. 3 is a block diagram showing the configuration of the DLL circuit 23 shown in FIG. 1.

As shown in FIG. 3, the DLL circuit 23 includes delay lines 80 and 81, counter circuits 82 and 83, a frequency dividing circuit 84, a phase detection circuit 85, a feedback circuit 86, a duty detection circuit 87, a signal combiner 88, and a level shift unit 89. The above circuits are so formed, in principle, as to operate on the internal voltage VPERI; however, some circuits operate on the external voltage VDD. The details will be explained in the description of each circuit.

As described above, the DLL circuit 23 is a circuit that generates the internal clock signals LCLKOET and LCLKOEFT. Each of the circuits except the feedback circuit 86 make up an internal clock signal generation circuit, which generates the internal clock signals LCLKOET and LCLKOEFT based on an external clock signal and an output signal of the feedback circuit 86. According to the present embodiment, as clearly shown in FIG. 3, the internal clock signal LCLKOET is a signal that is generated by delaying the internal clock signal LCLKOEFT through a delay circuit 97. However, the delay circuit 97 may not be provided, and the internal clock signals LCLKOET and LCLKOEFT may be the same.

As shown in FIG. 3, the feedback circuit 86 includes a structure in which a clock division circuit 90, a multiplexer 91, a level shift unit 92, an impedance adjustment unit 93, and a slew rate adjustment unit 94 are connected in series. To the clock division circuit 90, the internal clock signal LCLKOET is supplied. From the slew rate adjustment unit 94, feedback clock signals fbCLK and fbCLKB, which are complementary to each other, are output. The feedback clock signal fbCLK is supplied to the phase detection circuit 85, and to the duty detection circuit 87 via a buffer 96. The feedback clock signal fbCLKB is supplied to the duty detection circuit 87 via a buffer 95.

The clock division circuit 90, the multiplexer 91, the level shift unit 92, the impedance adjustment circuit 93, and the slew rate adjustment unit 94 each are a circuit that causes a delay equivalent to that caused by the clock division circuit 77, the multiplexer 76, the level shift unit 510, the impedance adjustment unit 520, and the slew rate adjustment unit 530, which are shown in FIG. 2. That is, the complementary feedback clock signals fbCLK and fbCLKB are signals delayed by an amount equivalent to that for the output signals of the slew rate adjustment unit 530 shown in FIG. 2, relative to the internal clock signals LCLKOET. Since the clock division circuit 77 and the multiplexer 76 are circuits that operate on the internal voltage VPERI, the clock division circuit 90 and the multiplexer 91, too, are circuits that operate on the internal voltage VPERI. Since the impedance adjustment unit 520 and the slew rate adjustment unit 530 are circuits that operate on the external voltage VDD, the impedance adjustment unit 93 and the slew rate adjustment unit 94, too, are circuits that operate on the external voltage VDD. Similarly to the level shift unit 510, the level shift unit 92 uses both the external voltage VDD and the internal voltage VPERI.

The delay line 80 is a circuit that generates an internal clock signal LCLK1 by delaying an internal clock signal PreCLK. A process of adjusting the amount of delay using the delay line 80 is performed based on a phase difference PD between the internal clock signal PreCLK and the feedback clock signal fbCLK. The phase difference PD is detected by the phase detection circuit 85.

The delay line 81 is a circuit that generates an internal clock signal LCLK2 by delaying an internal clock signal PreCLKB, which is obtained by inverting the internal clock signal PreCLK through an inverter. A process of adjusting the amount of delay using the delay line 81 is performed based on the duty DCC of the complementary internal clock signal LCLKOET. The duty DCC is detected by the duty detection circuit 87. The duty detection circuit 87 includes a function of detecting the duty of the internal clock signal LCLKOET based on the feedback clock signals fbCLK and fbCLKB.

In this case, the duty detection circuit 87 is so formed as to operate on the external voltage VDD in accordance with the amplitude values of the feedback clock signals fbCLK and fbCLKB. The amplitude value of the duty DCC, which is an output thereof, also serves as the external voltage VDD. Meanwhile, the counter circuit 83, to which the duty DCC is supplied, is so formed as to operate on the internal voltage VPERI. Between the duty detection circuit 87 and the counter circuit 83, a level shift unit 89 is provided; the level shift unit 89 converts the amplitude value of the duty DCC from external voltage VDD to internal voltage VPERI.

The internal clock signals LCLK1 and LCLK2 generated by the delay lines 80 and 81 are supplied to the signal combiner 88. The signal combiner 88 has a function of generating the internal clock signals LCLKOET and LCLKOEFT based on the internal clock signals LCLK1 and LCLK2.

Although not specifically limited, it is preferred that the delay lines 80 and 81 include a coarse delay line, which delays an external clock signal at a relatively coarse adjustment pitch, and a fine delay line, which delays an external clock signal at a relatively fine adjustment pitch.

The counter circuit 82 is a circuit that adjusts the amount of delay by the delay line 80. The count value of the counter circuit 82 is updated based on the phase difference PD supplied from the phase detection circuit 85 and in synchronization with a sampling clock signal SYNCLK supplied from the frequency dividing circuit 84, which is described later. More specifically, if the phase difference PD indicates that the phase has advanced too much, the counter circuit 82 carries out the up-counting of the count value thereof in synchronization with the sampling clock signal SYNCLK. In response, the delay line 80 delays a rising edge of the internal clock signal LCLK1. If the phase difference PD indicates that the phase has delayed, the counter circuit 82 carries out the down-counting of the count value thereof in synchronization with the sampling clock signal SYNCLK. In response, the delay line 80 accelerates a rising edge of the internal clock signal LCLK1. In that manner, the counter circuit 82 and the delay line 80 adjust the position of the rising edge of the internal clock signal LCLK1 based on the phase difference.

The frequency dividing circuit 84 is a circuit that generates the sampling clock signal SYNCLK by carrying out the frequency dividing of the internal clock signal PreCLK. The sampling clock signal SYNCLK is supplied to the counter circuits 82 and 83, where the sampling clock signal SYNCLK is used as a synchronization signal indicating the update timing of the count value. The reasons why the frequency dividing circuit 84 is used are that a certain period of time is required for updating the counter circuits 82 and 83 and changing the amounts of delay by the delay lines 80 and 81; and that it is difficult to carry out the updating of the counter circuits 82 and 83 and the changing of the amounts of delay by the delay lines 80 and 81 at every cycle of the internal clock signal PreCLK. Moreover, if the updating of the counter circuits 82 and 83 and the changing of the amounts of delay by the delay lines 80 and 81 are carried out more frequently than necessary, power consumption increases significantly.

The counter circuit 83 is a circuit that adjusts the amount of delay by the delay line 81. The count value of the counter circuit 83 is updated in synchronization with the sampling clock signal SYNCLK based on a duty DCC supplied from the duty detection circuit 87. More specifically, if the duty DCC is less than 50%, the counter circuit 83 carries out the up-counting of the count value thereof in synchronization with the sampling clock signal SYNCLK. In response, the delay line 81 delays a rising edge of the internal clock signal LCLK2. If the duty DCC is more than 50%, the counter circuit 83 carries out the down-counting of the count value thereof in synchronization with the sampling clock signal SYNCLK. In response, the delay line 81 hastens a rising edge of the internal clock signal LCLK2. In that manner, the counter circuit 83 and the delay line 81 adjust the position of the rising edge of the internal clock signal LCLK2 based on the duty.

As described above, the DLL circuit 23 includes circuits that operate on the internal voltage VPERI and circuits that operate on the external voltage VDD. The operating speed of a circuit that operates on the external voltage VDD varies as the external voltage VDD changes; the phase of the internal clock signal LCLKOEFT also varies. That is, for example, as the external voltage VDD goes up, the operating speeds of circuits that operate on the external voltage VDD in the feedback circuit 86 increase, meaning that the phases of the internal clock signals LCLKOET and LCLKOEFT are delayed. There is no problem with the internal clock signal LCLKOET because the operation is what is originally expected for the DLL circuit 23. However, the above internal clock signal LCLKOEFT could help to cause a decrease in the latch margin of the latency counter 55. Hereinafter, the configuration of the latency counter 55 designed to prevent a decrease in the latch margin will be described in detail.

Figure 4:
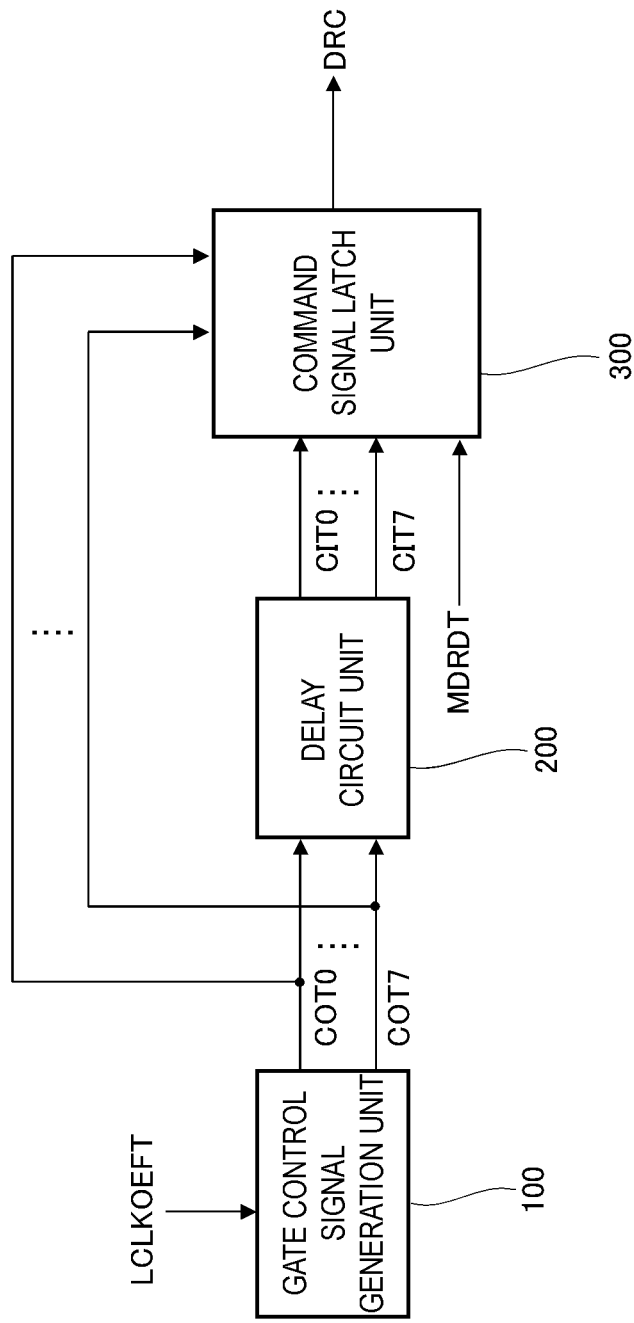
FIG. 4 is a block diagram showing the configuration of the latency counter 55 shown in FIG. 1.

As shown in FIG. 4, the latency counter 55 includes a gate control signal generation unit 100, a delay circuit unit 200, and a command signal latch unit 300. Appropriately referring to FIG. 5, the following describes the configuration of the latency counter 55.

Figure 5:
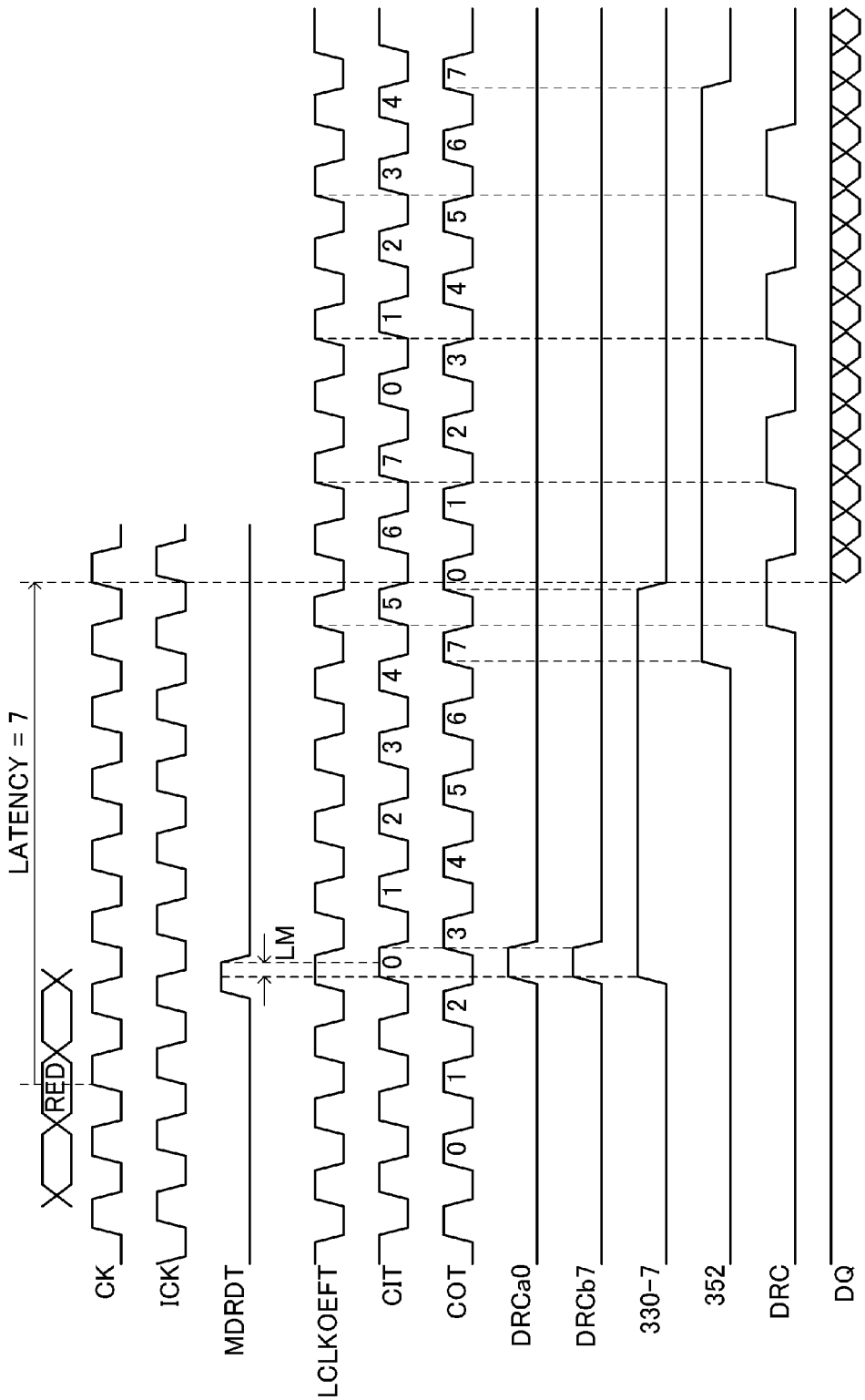
FIG. 5 is a diagram showing a timing chart of each signal pertaining to the latency counter 55 shown in FIG. 1.

The gate control signal generation unit 100 is a circuit that generates eight-line output gate signals COT0 to COT7 from the internal clock signal LCLKOEFT. The output gate signals COT0 to COT7 are so formed as to be sequentially activated in response to each clock, as shown in FIG. 5.

Figure 6:
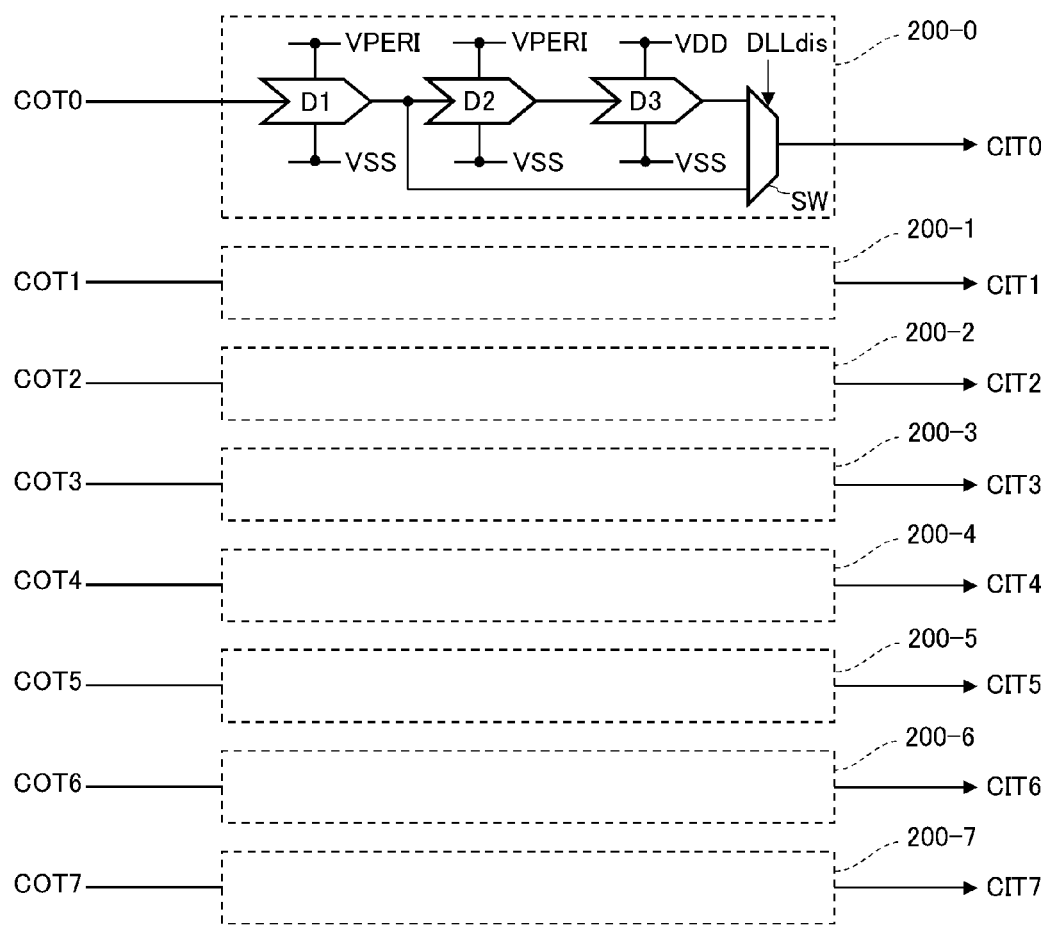
FIG. 6 is a block diagram showing the configuration of the delay circuit unit 200 shown in FIG. 4 and a circuit diagram of the delay circuit 200-0.

The delay circuit unit 200 is a circuit that generates eight-line input gate signals CIT0 to CIT7 by delaying the output gate signals COT0 to COT7. As shown in FIG. 6, the delay circuit unit 200 includes delay circuits 200-0 to 200-7, which each are so formed as to generate input gate signals CIT0 to CIT7 in response to the output gate signals COT0 to COT7, respectively.

As shown in FIG. 6, the delay circuit 200-0 includes a structure in which a delay element D1, a delay element D2, a delay element D3, and a switch SW are connected in series between an input port, to which the output gate signal COT0 is supplied, and an output port, from which the input gate signal CIT0 is output. The switch SW is a two-input one-output switch. One input port of the switch SW is connected to an output port of the delay element D2, and the other input port to an output port of the delay element D1. Although not shown in FIG. 6, the delay circuits 200-1 to 200-7 have the same circuit configuration as the delay circuit 200-0.

The delay elements D1 to D3 each include dozens of inverters. The delay element D1 is so formed as to cause a delay equivalent to the amount of signal delay in a circuit that transmits the internal read command MDRDT. The delay element D2 is so formed as to cause a delay equivalent to the amount of signal delay in a portion of the DLL circuit 23 that operates on the internal voltage VPERI. The delay element D3 is so formed as to cause a delay equivalent to the amount of signal delay in a portion of the DLL circuit 23 that operates on the external voltage VDD.

If the above-described mode signal DLLdis indicates that the DLL circuit 23 is not used, the switch SW outputs an output signal of the delay element D1 as the input gate signal CIT0. If the mode signal DLLdis indicates that the DLL circuit 23 is used, the switch SW outputs an output signal of the delay element D3 as the input gate signal CIT0.

As shown in FIG. 6, both the delay elements D1 and D2 are so formed as to operate on the internal voltage VPERI. The same is true for the switch SW. The delay element D3 is so formed as to operate on the external voltage VDD. Therefore, the amount of signal delay by the delay element D3 is affected by a change in the external voltage VDD. For example, if the external voltage VDD rises, the speed of each of the transistors that make up the inverters in the delay element D3 increases, resulting in a decrease in the amount of signal delay.

An increase or decrease in the amount of signal delay has effect in canceling variations in the phase of the internal clock signal LCLKOEFT resulting from a change in the external voltage VDD. That is, as described above, as the external voltage VDD goes up, the phase of the internal clock signal LCLKOEFT changes in such a way that the phase is delayed. Meanwhile, as the external voltage VDD goes up, the amount of signal delay by the delay element D3 changes in such a way that the amount of signal delay decreases. That is, the delay in the internal clock signal LCLKOEFT is compensated for by the decrease in the amount of signal delay by the delay element D3. The same is true for the case where the external voltage VDD goes down: the lead of the internal clock signal LCLKOEFT is canceled by the increase in the amount of signal delay by the delay element D3. Therefore, it can be said that the variations in the phase of the input gate signals CIT0 to CIT7 resulting from a change in the external voltage VDD are curbed.

As the signals are delayed in the delay circuit unit 200 as described above, the input gate signals CIT0 to CIT7 turn out to be signals that are generated by delaying the output gate signals COT0 to COT7 by a predetermined period of time, as shown in FIG. 5.

To the command signal latch unit 300, the above-described output gate signals COT0 to COT7 and input gate signals CIT0 to CIT7, and the internal read command MDRDT are supplied. The command signal latch unit 300 is so formed as to accept, when the internal read command MDRDT is supplied, the internal read command MDRDT in synchronization with the input gate signal that is activated at the time, as shown in FIG. 5. In the example shown in FIG. 5, the command signal latch unit 300 accepts the internal read command MDRDT in synchronization with the input gate signal CIT0.

Incidentally, even though not shown in FIG. 4, the internal read command MDRDT is so formed as to pass through a delay circuit that causes a delay equivalent to the amount of signal delay by the DLL circuit 23 before being accepted in synchronization with the input gate signal. However, if the mode signal DLLdis indicates that the DLL circuit 23 is not used, the delay circuit is skipped. According to this configuration, a misalignment in timing between the internal read command MDRDT and the input gate signal CIT0 to CIT7 is prevented. Incidentally, the delay circuit is so formed as to operate on the internal voltage VPERI. Therefore, the delay circuit is not affected by a change in the external voltage VDD; the amount of signal delay by the delay circuit is equivalent to the amount of signal delay by the DLL circuit 23 in case there is no change in the external voltage VDD.

The output gate signals COT0 to COT7 and the input gate signals CIT0 to CIT7 are associated with one another on a one-to-one basis in accordance with the CAS latency CL. In the example (CL=7) shown in FIG. 5, the input gate signals CIT0 to CIT7 are associated with the output gate signals COT7 and COT0 to COT6, respectively. The following provides an explanation using the example of FIG. 5: The command signal latch unit 300 starts activating an internal read command DRC, which is an output signal of the latency counter 55, at a time when the output gate signal COT7, which corresponds to the input gate signal CIT0 used for accepting the internal read command MDRDT, becomes activated; in response, a process of outputting read data from the FIFO circuit 75 starts, and read data DQ is output from the data input/output terminal 16 via the data input/output circuit 78.

As described above, in the latency counter 55 of the present embodiment, the delay element D3, which operates on the external voltage VDD, is provided in the delay circuit 200 to curb the variations in the phases of the input gate signals CIT0 to CIT7 resulting from a change in the external voltage VDD. Accordingly, the following is prevented from occurring: the differences between the phases of the input gate signals CIT0 to CIT7 and the phase of the internal read command MDRDT, which are attributable to a change in the external voltage VDD. Therefore, a decline in the latch margin LM (FIG. 5) of the latency counter resulting from a change in the external voltage VDD is curbed.

The following describes in more detail the configuration of the latency counter 55.

Figure 7:
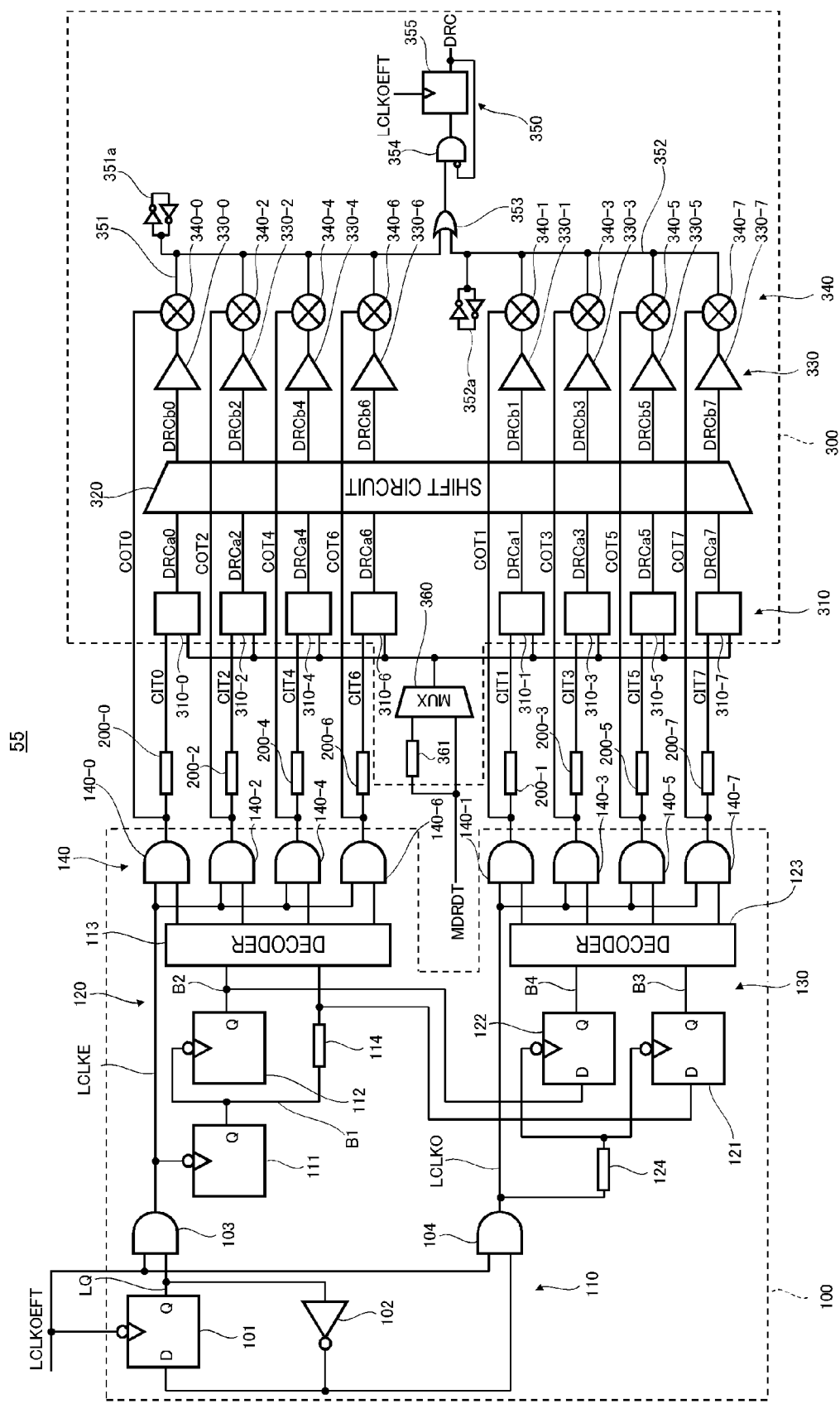
FIG. 7 is a diagram showing in detail an example of the configuration of the latency counter 55 shown in FIG. 1.

As shown in FIG. 7, a gate control signal generation unit 100 according to an example of the latency counter 55 includes a frequency dividing circuit 110, which generates frequency division clock signals LCLKE and LCLKO based on the internal clock signal LCLKOEFT; a first counter circuit 120, which counts the frequency division clock signal LCLKE; a second counter circuit 130, which accepts a count value of the first counter circuit 120 in synchronization with the frequency division clock signal LCLKO; and a selection circuit 140, which selects exclusively the count values of the first and second counter circuits 120 and 130. The command signal latch unit 300 includes an input selection circuit 310, a shift circuit 320, a latch circuit 330, an output selection circuit 340, and an output combining circuit 350.

First, the configuration of the gate control signal generation unit 100 will be described. The frequency dividing circuit 110 includes a latch circuit 101, which carries out a latch operation in synchronization with a falling edge of the internal clock signal LCLKOEFT; an inverter 102, which inverts a frequency division signal LQ output from an output port Q of the latch circuit 101 and then supplies the resultant signal to an input port D; an AND circuit 103, which calculates the logical product of the internal clock signal LCLKOEFT and the frequency division signal LQ; and an AND circuit 104, which calculates the logical product of the internal clock signal LCLKOEFT and an inverted signal of the frequency division signal LQ.

Since the circuit is formed as described above, as shown in FIG. 7, the frequency division clock signal LCLKE output from the AND circuit 103 has a waveform that varies according to the even-numbered internal clock signals LCLKOEFT; the frequency division clock signal LCLKO output from the AND circuit 104 has a waveform that varies according to the odd-numbered internal clock signals LCLKOEFT. Accordingly, the active periods of the frequency division clock signals LCLKE and LCLKO (or the periods during which the frequency division clock signals LCLKE and LCLKO are at a high level) are 0.5tCK; the non-active periods (or the periods during which the frequency division clock signals LCLKE and LCLKO are at a low level) are 1.5tCK. Here, time 1tCK is equivalent to one cycle of the internal clock signal LCLKOEFT.

The frequency dividing circuit 110 generates two frequency division clock signals LCLKE and LCLKO, which are different in phase from each other, by dividing the frequency of the internal clock signal LCLKOEFT by two. The generated frequency division clock signals LCLKE and LCLKO are supplied to the first and second counter circuits 120 and 130, respectively, as shown in FIG. 7. As a result, the first and second counter circuits 120 and 130 each operate at half of the frequency of the internal clock signal LCLKOEFT.

The first counter circuit 120 includes a 2-bit ripple counter, in which flip-flops 111 and 112 of a ripple type are connected in cascade; and a decoder 113, which decodes an output of the ripple counter. To a clock port of the flip-flop 111, the frequency division clock signal LCLKE is supplied. The second counter circuit 130 includes flip-flops 121 and 122 of a data latch type, and a decoder 123, which decodes outputs of the flip-flops 121 and 122. To clock ports of the flip-flops 121 and 122, the frequency division clock signal LCLKO, which has been delayed by a delay circuit 124 that has an amount of delay equivalent to two stages of flip-flops, is supplied. An output bit B1 of the flip-flop 111 is supplied to the decoder 113 and a data input port D of the flop-flop 121 via a delay circuit 114, which has an amount of delay equivalent to one stage of flip flop. An output bit B2 of the flip-flop 112 is supplied to the decoder 113 and a data input port D of the flop-flop 122 without passing through a delay circuit. Both an output bit B3 of the flip-flop 121 and an output bit B4 of the flip-flop 122 are supplied to the decoder 123. Incidentally, the reason why the delay circuits 114 and 124 are provided is to prevent a difference in change timing between the output bits B1 to B4 from occurring.

The selection circuit 140 includes eight AND circuits 140-0 to 140-7. The decoder 113 has four output lines, which are connected to the AND circuits 140-0, 140-2, 140-4, and 140-6. Based on the value of a binary signal in which bit B1 is a low-order bit and bit B2 is a high-order bit, the decoder 113 activates one of the four output lines to a high level. The decoder 123, too, has four output lines, which are connected to the AND circuits 140-1, 140-3, 140-5, and 140-7. Based on the value of a binary signal in which bit B3 is a low-order bit and bit B4 is a high-order bit, the decoder 123 activates one of the four output lines to a high level.

To the AND circuits 140-0, 140-2, 140-4, and 140-6, the frequency division clock signal LCLKE is supplied, too. To the AND circuits 140-1, 140-3, 140-5, and 140-7, the division clock signal LCLKO is supplied, too. Output signals of the AND circuits 140-0 to 140-7 each turn out to be the above-described output gate signals COT0 to COT7.

According to the above configuration, the output gate signals COT0 to COT7 are signals that are sequentially activated in response to each clock, as shown in FIG. 5. As show in FIG. 7, the output gate signals COT0 to COT7 are supplied to corresponding delay circuits 200-0 to 200-7, and to the output selection circuit 340 in the command signal latch unit 300.

The following describes the configuration of the command signal latch unit 300. As shown in FIG. 7, to the command signal latch unit 300, the internal read command MDRDT is supplied. An end portion of the command signal latch unit 300, to which the internal read command MDRDT is supplied, is connected to a multiplexer 360 through two lines. One of the lines is connected directly to the multiplexer 360. The other line is connected to the multiplexer 360 via a delay circuit 361. The delay circuit 361 is so formed as to operate on the internal voltage VPERI.

An output port of the multiplexer 360 is connected to the input selection circuit 310. If the above-described mode signal DLLdis indicates that the DLL circuit 23 is used, the multiplexer 360 supplies to the input selection circuit 310 the internal read command MDRDT that has passed through the delay circuit 361. If the above-described mode signal DLLdis indicates that the DLL circuit 23 is not used, the multiplexer 360 supplies to the input selection circuit 310 the internal read command MDRDT that has not passed through the delay circuit 361. The reason is to prevent a difference in timing between the internal read command MDRDT and the input gate signals CIT0 to CIT7 from occurring.

The input selection circuit 310 includes eight timing control circuits 310-0 to 310-7. To the timing control circuits 310-0 to 310-7, the read command MDRDT is commonly input from the multiplexer 360. Moreover, to the timing control circuits 310-0 to 310-7, the input gate signals CIT0 to CIT7 each are input.

An output signal of the timing control circuit 310-0 is an internal read command DRCa0. As shown in FIG. 5 as an example, the timing control circuit 310-0 activates the internal read command DRCa0 when both the internal read command MDRDT and the input gate signal CIT0 are activated; and deactivates the internal read command DRCa0 in response to the deactivation of the input gate signal CIT0. The same is true for the timing control circuits 310-1 to 310-7. Output signals of the timing control circuits 310-1 to 310-7 are internal read commands DRCa1 to DRCa7, respectively. The internal read commands DRCa0 to DRCa7 are supplied to the shift circuit 320.

The shift circuit 320 is a circuit that outputs the internal read commands DRCb0 to DRCb7 for each output gate signal. The shift circuit 320 includes a function of assigning the internal read commands DRCa0 to DRCa7, which are supplied from the input selection circuit 310, to the internal read commands DRCb0 to DRCb7 in accordance with the CAS latency CA.

Figure 8:
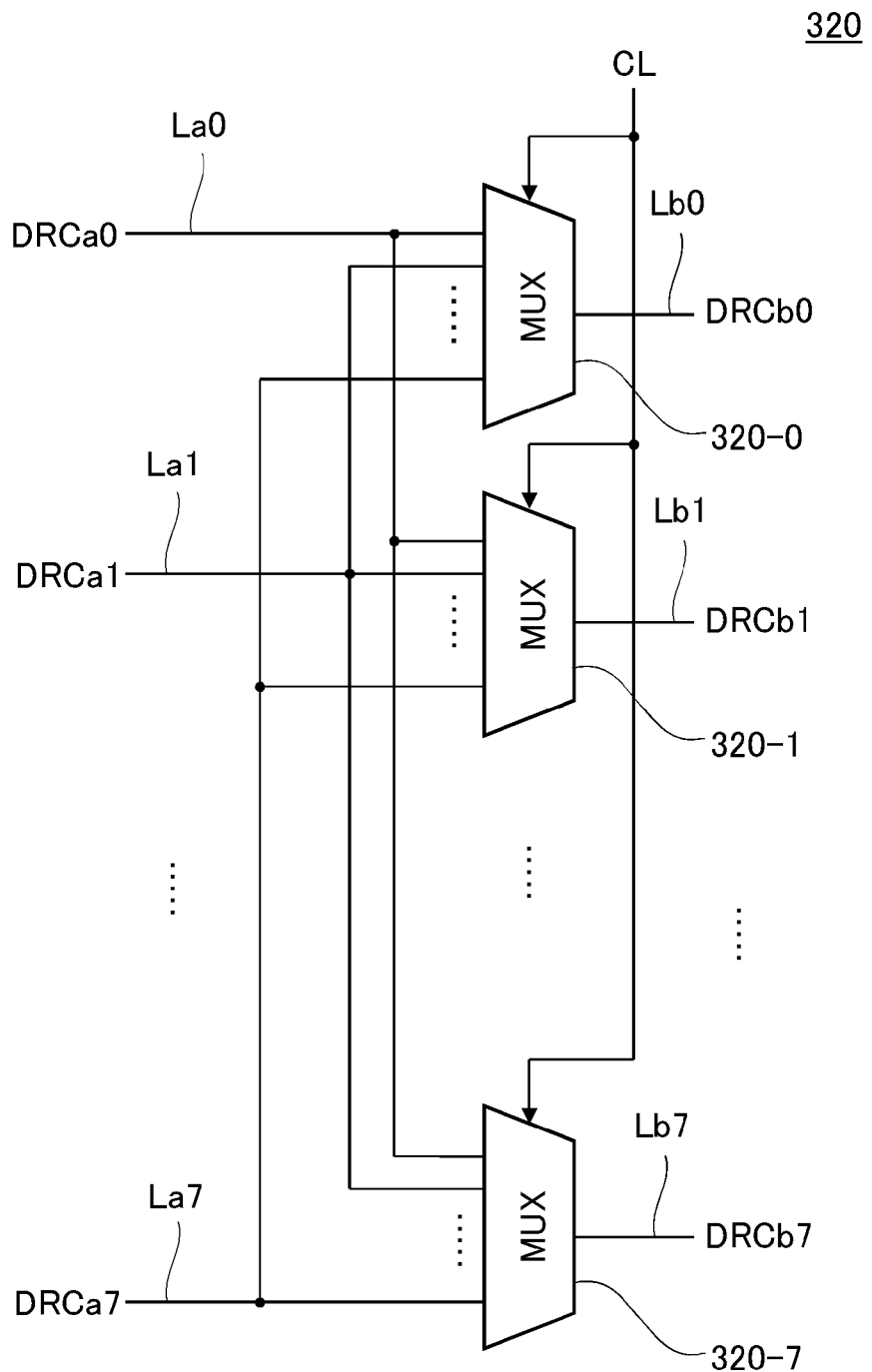
FIG. 8 is a circuit diagram of the shift circuit 320 shown in FIG. 7.

As shown in FIG. 8, the shift circuit 320 includes signal paths La0 to La7, to which the internal read commands DRCa0 to DRCa7 are respectively supplied; signal paths Lb0 to Lb7, from which the internal read commands DRCb0 to DRCb7 are respectively output; and multiplexers 320-0 to 320-7, which are provided between the signal paths La0 to La7 and Lb0 to Lb7.

The multiplexers 320-0 to 320-7 are connected to all the signal paths La0 to La7. Accordingly, to the multiplexers 320-0 to 320-7, all the internal read commands DRCa0 to DRCa7 are supplied. Outputs of the multiplexers 320-0 to 320-7 are connected to the signal paths Lb0 to Lb7, respectively. The multiplexers 320-0 to 320-7 are circuits that connect one of the signal paths La0 to La7 to a corresponding signal path, which is one of the signal paths Lb0 to Lb7. To the multiplexers 320-0 to 320-7, the CAS latency CL is supplied from the mode register 56, thereby determining the connection within each multiplexer.

Figure 9A:
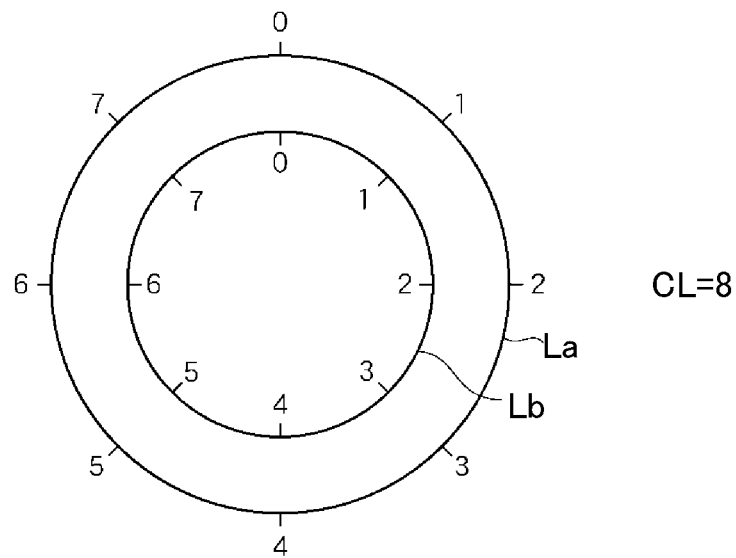
FIGS. 9A and 9B are diagrams illustrating the relationship between the CAS latency CL and the connection within each multiplexer.
Figure 9B:
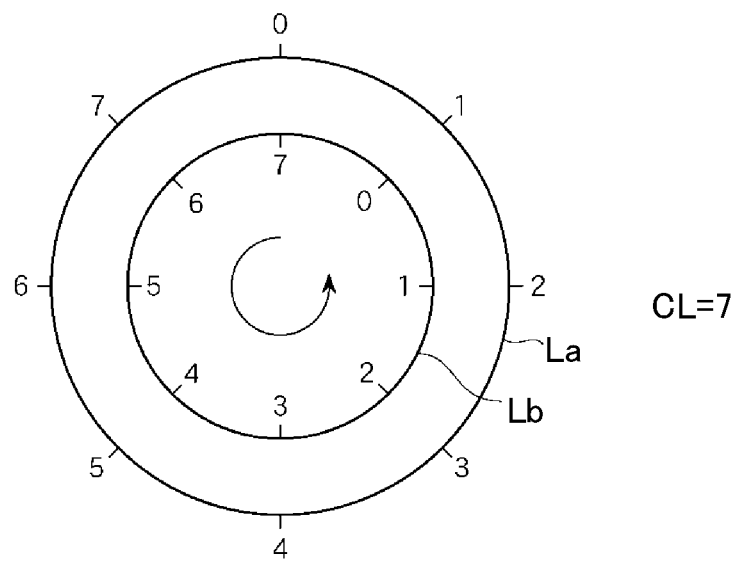

Turning to FIGS. 9A and 9B, FIG. 9A shows an example of CL=8 and FIG. 9B shows an example of CL=7.

An outer ring La shown in FIGS. 9A and 9B represents input-side signal paths La0 to La7. An inner ring Lb represents output-side signal paths Lb0 to Lb7. The two signal paths whose scale marks on the rings are positioned at the same location are connected to each other within each multiplexer.

More specifically, in the example (CL=8) shown in FIG. 9A, a difference between the signal paths La0 to La7 and the signal paths Lb0 to Lb7 is set to "0." In this case, the signal paths La0 to La7 are connected to the signal paths Lb0 to Lb7, respectively. Meanwhile, in the example (CL=7) shown in FIG. 9B, the difference between the signal paths La0 to La7 and the signal paths Lb0 to Lb7 is set to "7." In this case, the signal paths La0 to La7 are connected to the signal paths Lb7 and Lb0 to Lb6, respectively.

The difference can be set to one of the numbers 0 to 7. After the difference is set, the correspondence relationship between the input-side signal paths La and the output-side signal paths Lb remain unchanged. In this manner, the shift circuit 320 plays a role in shifting the correspondence relationship between the input-side signal paths La and the output-side signal paths Lb based on the CAS latency CL.

The internal read commands DRCb0 to DRCb7 output from the shift circuit 320 are supplied to latch circuits 330-0 to 330-7, respectively, which make up the latch circuit 330. To subsequent stages of the latch circuits 330-0 to 330-7, output gate input selection circuits 340-0 to 340-7, which make up the output selection circuit 340, are connected, respectively.

Also referring to FIG. 5, the following provides a description focusing on the operation of the latch circuit 330-7 and the output gate 340-7.

As shown in FIG. 5, the latch circuit 330-7 is set as the internal read command DRCb7 input becomes activated; and then remains unchanged at least until the next deactivation of the corresponding output gate signal COT7 takes place. Preferably, the latch circuit 330-7 is reset at a time when the next activation of another output gate signal (which is the output gate signal CIT0 in this case) takes place after the output gate signal COT7 is deactivated.

The output gate 340-7 is a circuit that outputs an output of the latch circuit 330-7 to a line 352 during a period of time when the corresponding output gate signal COT7 is being activated. When the output gate signal COT7 is not activated, an output of the output gate 340-7 is in the state of high impedance. When the output gate signal COT7 becomes activated, and when an output of the latch circuit 330-7 is at a high level, an output of the output gate 340-7 is at a high level. When the output gate signal COT7 becomes activated, and when an output of the latch circuit 330-7 is at a low level, an output of the output gate 340-7 is at a low level.

To the line 352, as shown in FIG. 7, a latch circuit 352a is connected. Therefore, once an output of the output gate 340-7 is brought to a high level, the potential of the line 352 is kept at a high level as shown in FIG. 5 until the output of the output gate 340-7 returns back to a low level.

The operations of the latch circuits 330-0 to 330-6 and the output gates 340-0 to 340-6 are the same as those of the latch circuit 330-7 and the output gate 340-7. However, as shown in FIG. 7, outputs of the latch circuits 330-0, 330-2, 330-4, and 330-6 are supplied to a line 351, not to the line 352. Even to the line 351, a latch circuit 351a is connected to keep an output of an output gate.

The lines 351 and 352 are connected to an input port of an OR gate circuit 353. An output signal of the OR gate circuit 353 is supplied to the output combining circuit 350.

The output combining circuit 350 includes an AND gate circuit 354 and a latch circuit 355. An output signal of the OR gate circuit 353 passes through the AND gate circuit 354, and is then latched by the latch circuit 355 before being output as an internal read command DRC. As described above with reference to FIG. 1, the internal read command DRC is supplied to the FIFO circuit 75, thereby specifying an output timing of the read data DQ.

The latch circuit 355 performs a latch operation in synchronization with the internal clock signal LCLKOEFT. An output of the latch circuit 355 is inverted before being fed back to the AND gate circuit 354. Accordingly, the active period of the internal read command DRC is 1tCK as shown in FIG. 5. When the line 351 or 352 is being activated, the activation and deactivation of the internal read command DRC is repeated at intervals of 1tCK.

As described above, in the semiconductor device 10 of the present embodiment, the delay element D3, which operates on the external voltage VDD, is provided in the delay circuit 200 of the latency counter 55. Therefore, the variations in the phases of the input gate signals CIT0 to CIT7 resulting from a change in the external voltage VDD are curbed. Accordingly, a decline in the latch margin of the latency counter 55 resulting from a change in the external voltage VDD is curbed.

The following describes a second preferred embodiment of the present invention. The semiconductor device 10 of the present embodiment is different from the first embodiment in that: the active period of the internal read command MDRDT, which is 0.5tCK in the first embodiment, is set longer than 0.5tCK; and the configuration of the latency counter 55 is modified accordingly.

The reason why the active period of the internal read command MDRDT is made longer is to increase the latch margin of the latency counter 55, thereby reducing the possibility that the latency counter 55 would fail to accept the internal read command MDRDT. However, as the active period of the internal read command MDRDT is made longer, there is the possibility that the latency counter 55 would malfunction if the phase of the internal read command MDRDT is shifted for some reason.

Figure 10:
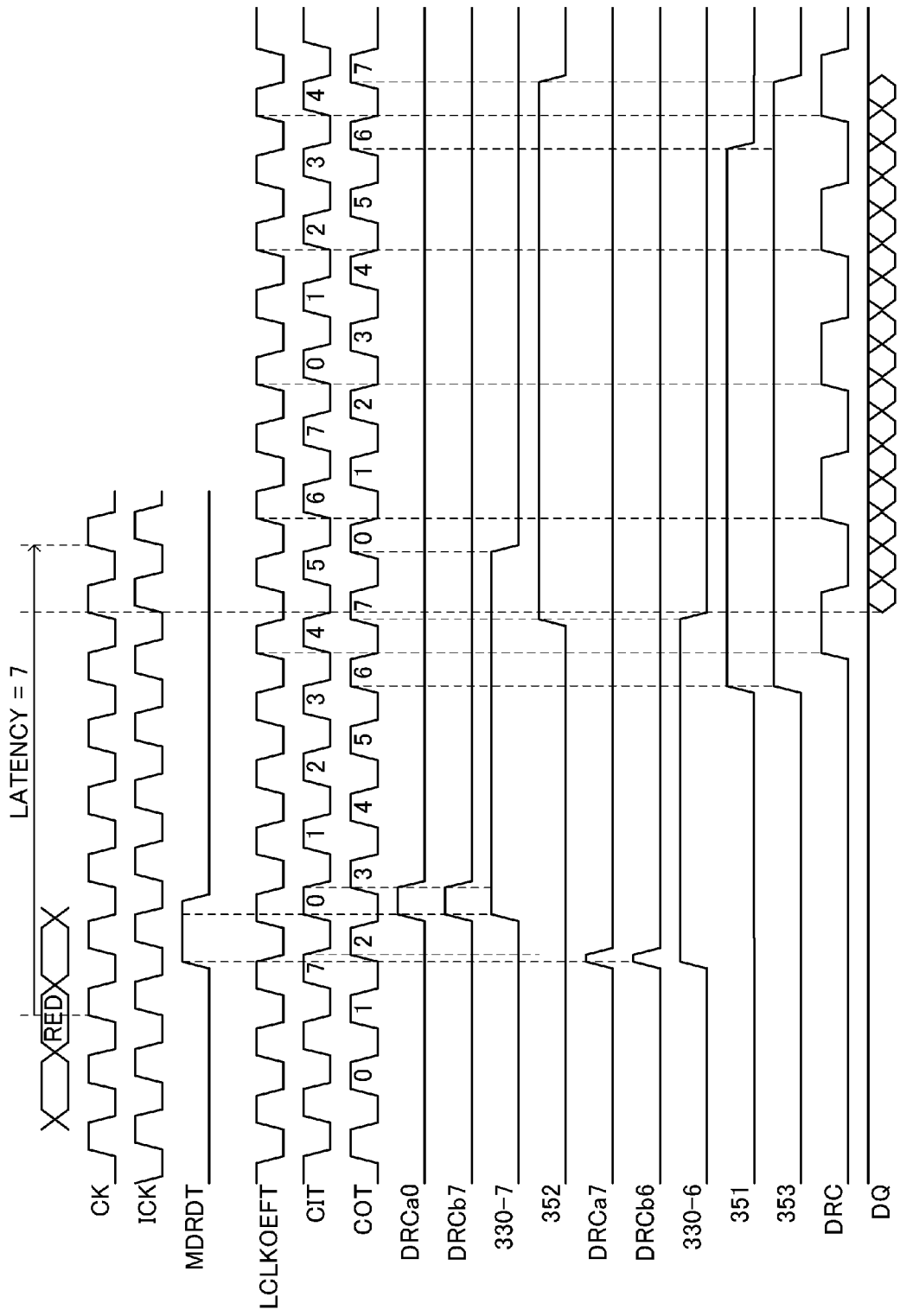
FIG. 10 is a diagram showing a timing chart of each signal pertaining to the latency counter 55 when the latency counter 55 is malfunctioning.

FIG. 10 shows an example in which a malfunction occurs as the phase of the internal read command MDRDT, whose active period is increased to 1tCK (which is double that of the first embodiment), has advanced ahead of the original phase. Also referring to the latency counter 55 shown in FIG. 7, the following describes in detail how the malfunction occurs.

As shown in FIG. 10, in the example here, the active period of the input gate signal CIT0, as well as the active period of the input gate signal CIT7 that becomes activated one clock before the input gate signal CIT0, overlaps with the active period of the internal read command MDRDT. As a result, the latency counter 55 accepts the internal read command MDRDT in synchronization with not only the input gate signal CIT0 but also the input gate signal CIT7, which becomes activated one clock before the input gate signal CIT0. The above is proved by the activation of not only the internal read command DRCa0 but also of the internal read command DRCa7 in the case of FIG. 10.

As the internal read command DRCa7 is activated, the internal read command DRCb6 and an output of the latch circuit 330-6, too, become activated. Furthermore, at an activation timing of the output gate signal COT6, the line 351 becomes activated. Accordingly, an output of the OR gate circuit 353 becomes activated at an activation timing of the output gate signal COT6 as shown in FIG. 10. Thus, the activation of the internal read command DRC starts one clock earlier than in the example shown in FIG. 5. As a result, as shown in FIG. 10, a process of outputting read data DQ starts one clock earlier than the original timing indicated by the CAS latency. That is, the above process does not comply with the CAS latency, and it is therefore judged that malfunction of the latency counter 55 has occurred.

In order to prevent such a malfunction, the latency counter 55 of the present embodiment accepts the internal read command MDRDT at a rise edge (rising edge) of the input gate signal. The details will be described below.

Figure 11:
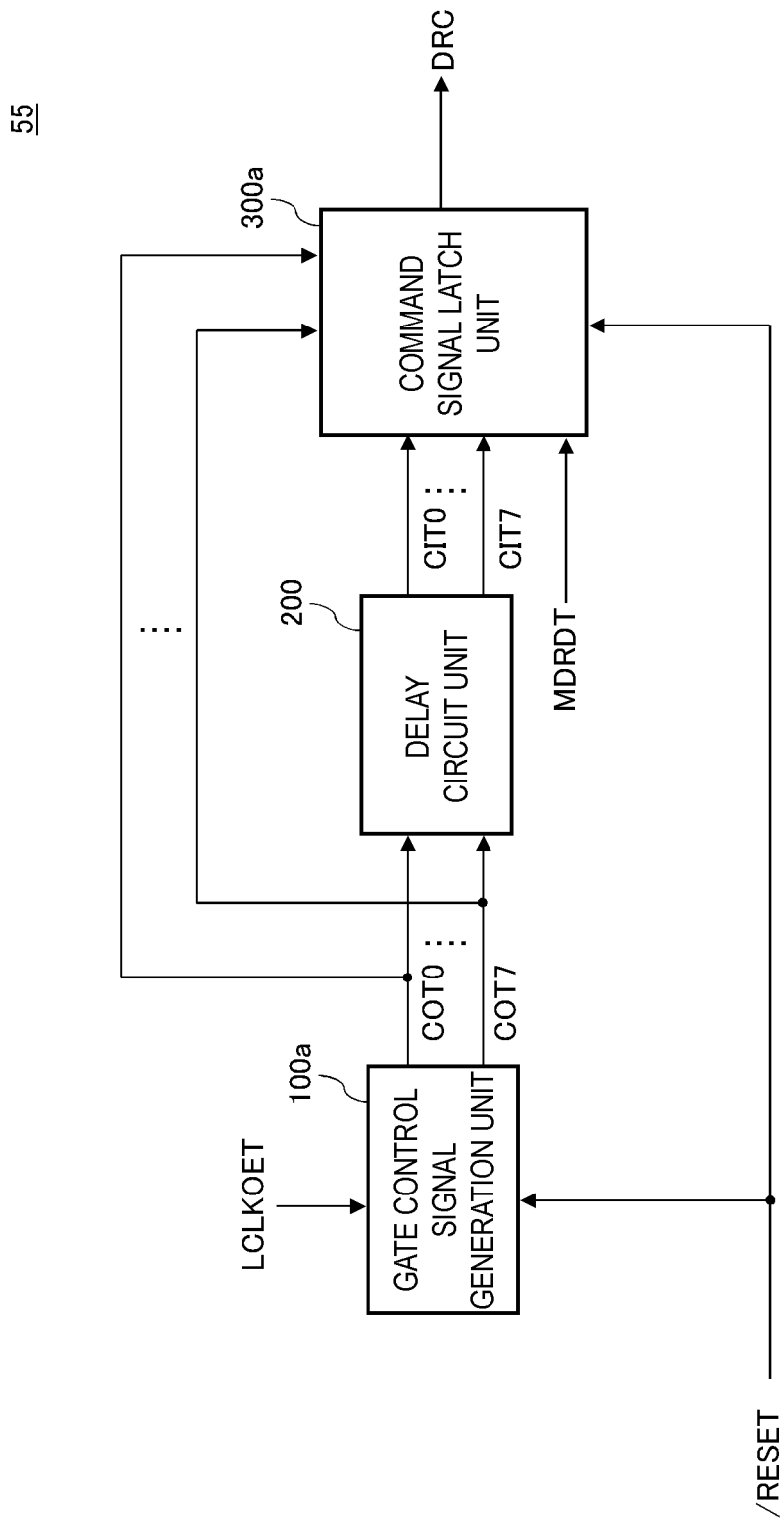
FIG. 11 is a block diagram showing the configuration of the latency counter 55 according to a second preferred embodiment of the present invention.

As shown in FIG. 11, the latency counter 55 of the present embodiment includes a gate control signal generation unit 100a, a delay circuit unit 200, and a command signal latch unit 300a. The delay circuit unit 200 is the same as that described in the first embodiment. The gate control signal generation unit 100a and the command signal latch unit 300a are different in configuration from the gate control signal generation unit 100 and the command signal latch unit 300, which are described in the first embodiment. Therefore, the following describes the gate control signal generation unit 100a and the command signal latch unit 300a referring to FIG. 11 as well as FIG. 12 to FIG. 14.

Figure 13:
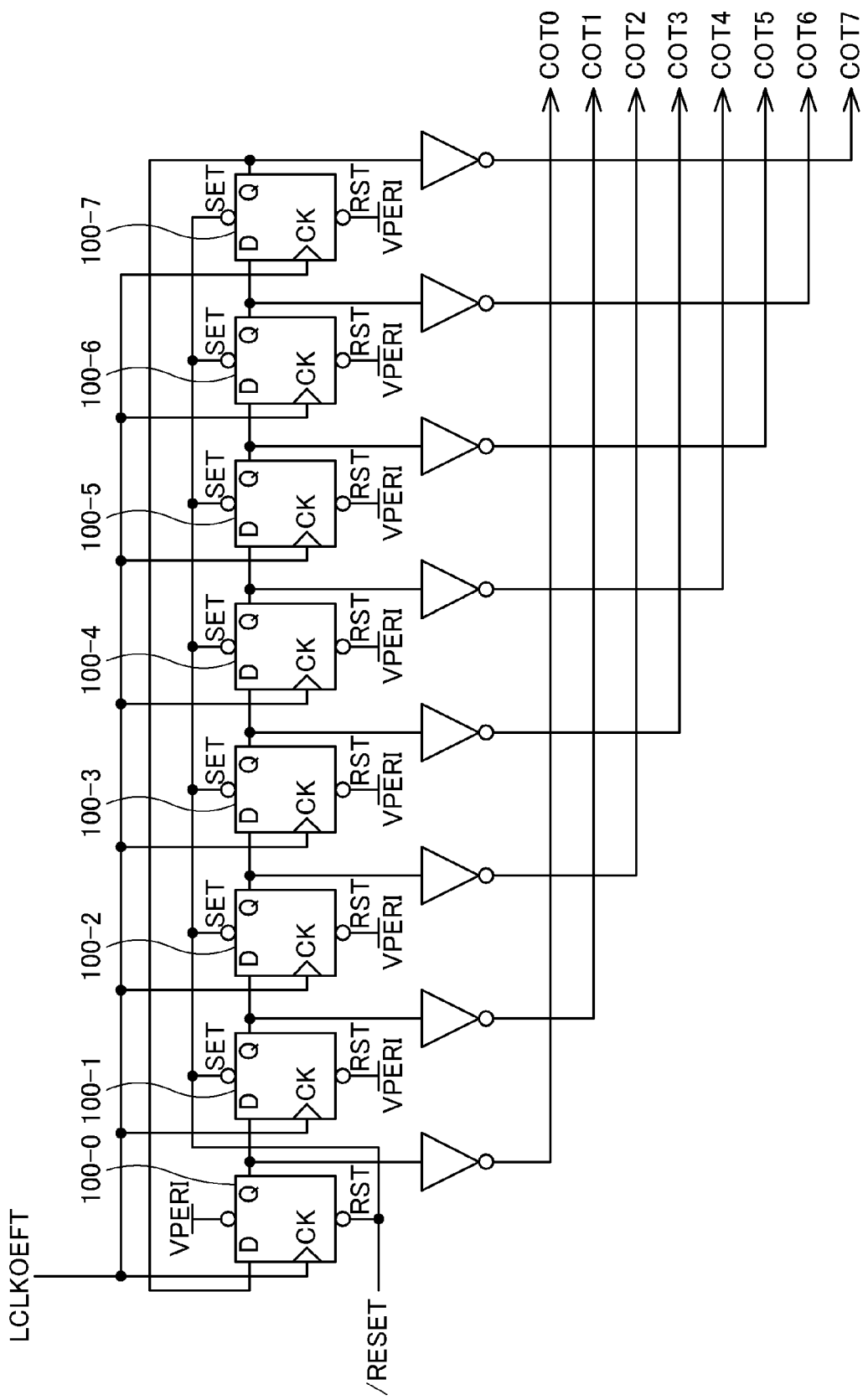
FIG. 13 is a circuit diagram of the gate control signal generation unit 100a shown in FIG. 11.

As shown in FIG. 13, the gate control signal generation unit 100a includes eight flip-flops 100-0 to 100-7 (first flip-flops) that are connected in cascade. An output terminal Q of the final-stage flip-flop 100-7 is connected to an input terminal D of the first-stage flip-flop 100-0.

As shown in FIG. 13, the flop-flops 100-0 to 100-7 are D-type flip-flops of an edge-triggered type, and have the following characteristic: the value of an input terminal D at a rise edge of a clock terminal CK is output from an output terminal Q, and the value is saved until the next rise edge of the clock terminal CK. The flip-flops 100-0 to 100-7 each have a set terminal SET and a reset terminal RST, and have the following characteristic: when the set terminal SET is at a high level and the reset terminal RST at a low level, the output terminal Q is set to a high level; and, when the set terminal SET is at a low level and the reset terminal RST at a high level, the output terminal Q is set to a low level.

To the clock terminals CK of the flop-flops 100-0 to 100-7, the internal clock signal LCLKOEFT is commonly supplied. To the reset terminal RST of the flip-flop 100-0 and to the set terminals SET of the flop-flops 100-1 to 100-7, a reset signal/RESET, which is a low-active signal, is supplied. The reset signal/RESET is a signal that is supplied to the semiconductor device 10 from an external controller via a reset terminal not shown in the diagram, and to the latency counter 55 via a level shift circuit not shown in the diagram. To the set terminal SET of the flip-flop 100-0 and to the reset terminals RST of the flop-flops 100-1 to 100-7, the internal voltage VPERI is supplied. At a time when the reset signal/RESET is input to the latency counter 55, the amplitude value of the reset signal/RESET is equal to that of the internal voltage VPERI. The output signals of the flop-flops 100-0 to 100-7 are inverted by inverters before becoming the output gate signals COT0 to COT7 as shown in FIG. 13.

Figure 12:
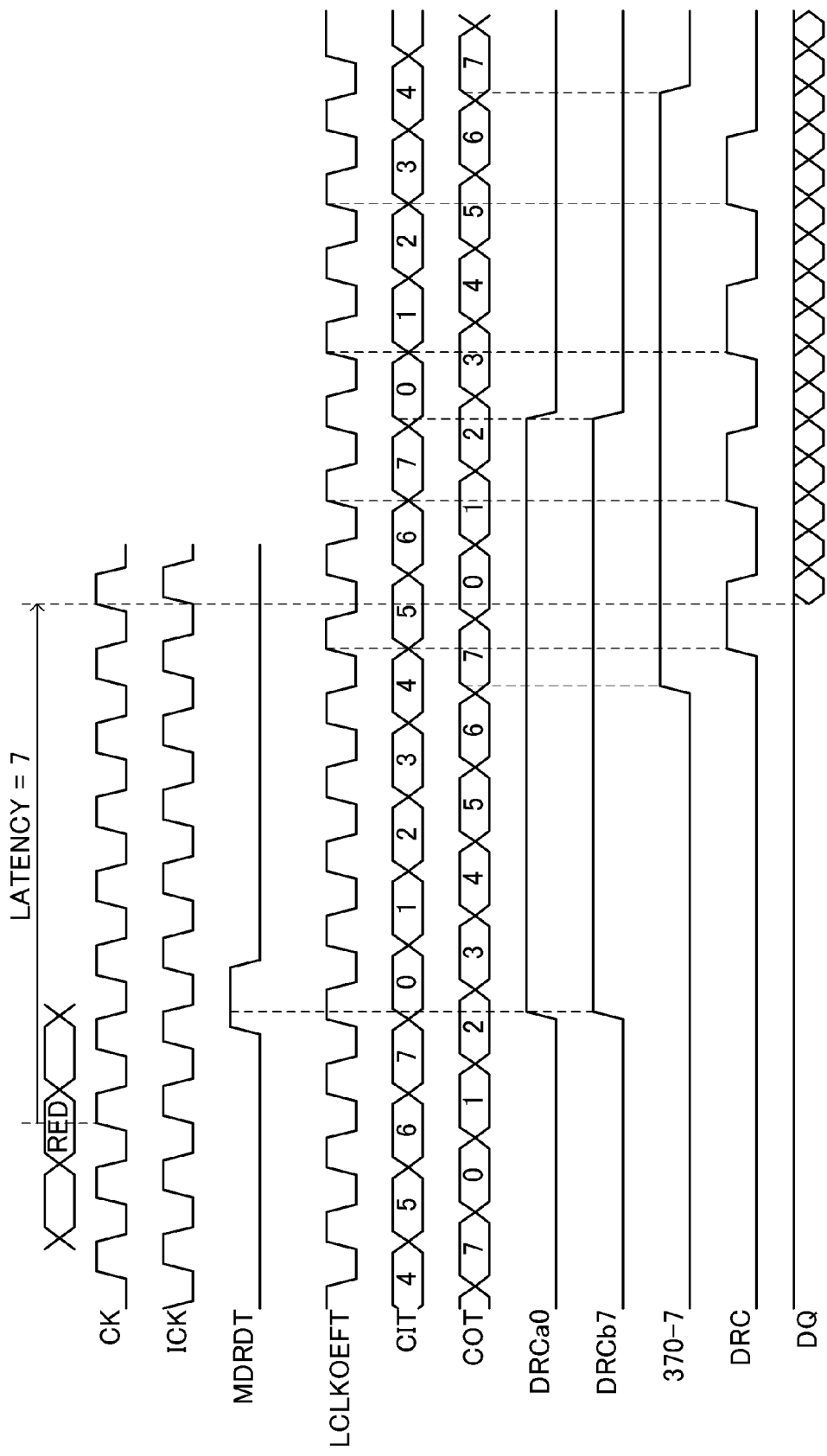
FIG. 12 is a diagram showing a timing chart of each signal pertaining to the latency counter 55 shown in FIG. 11.

According to the above-described configuration of the gate control signal generation unit 100a, the output gate signals COT0 to COT7, and the input gate signals CIT0 to CIT7, which are generated through the delay circuit 200, turn out to be signals with a width of 1tCK, as shown in FIG. 12. The positions of the rise edges of the above signals of the present embodiment are the same as the positions of the rise edges of the first embodiment, which are shown in FIG. 5.

Figure 14:
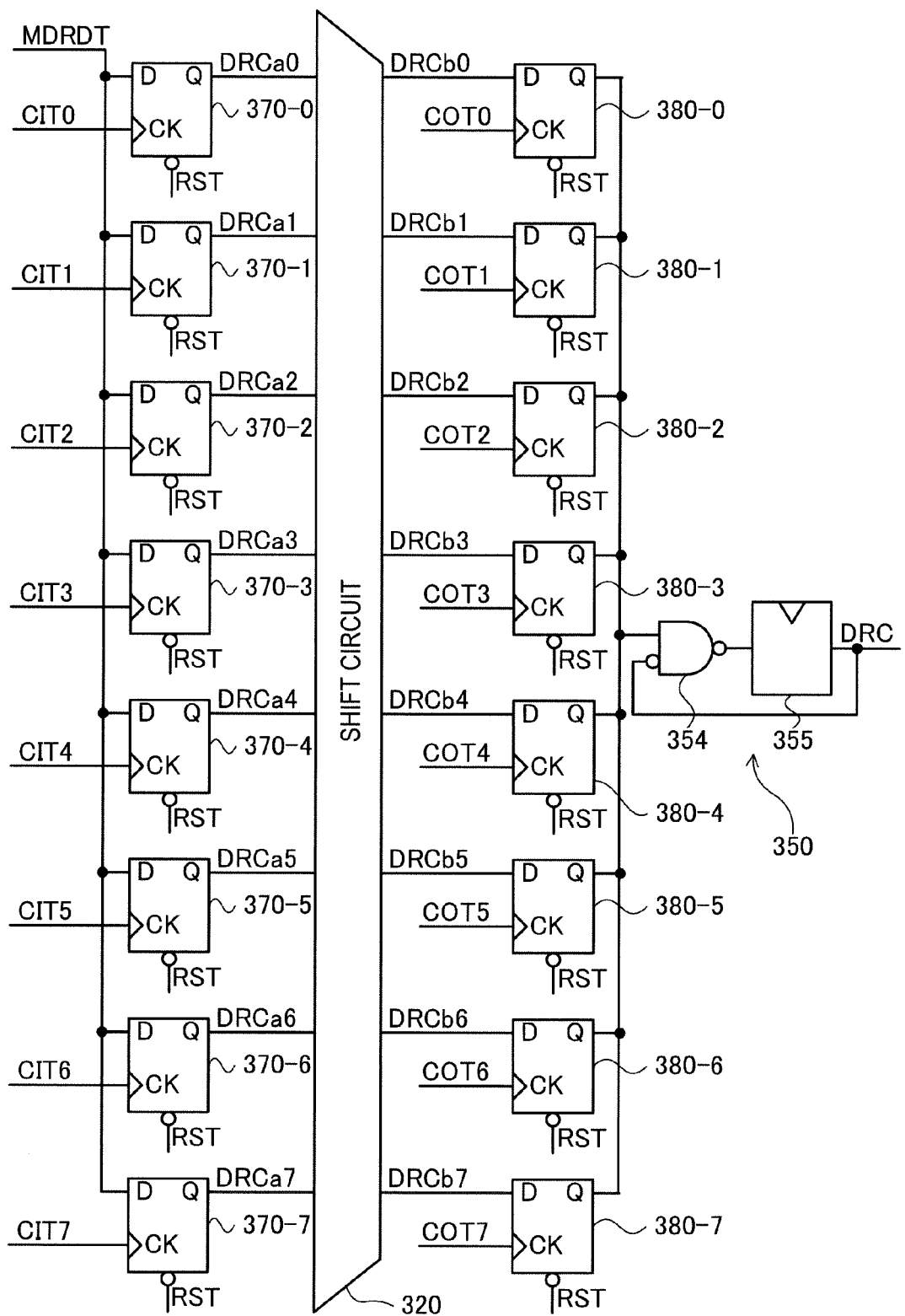
FIG. 14 is a circuit diagram of the command signal latch unit 300a shown in FIG. 11.

As shown in FIG. 14, the gate control signal generation unit 100a includes an input selection circuit 370, a shift circuit 320, an output selection circuit 380, and an output combining circuit 350. The shift circuit 320 and the output combining circuit 350 are the same as those described in the first embodiment, and the description thereof therefore will be omitted. The following describes in detail the input selection circuit 370 and the output selection circuit 380.

The input selection circuit 370 includes eight flip-flops 370-0 to 370-7 (second flip-flops). To input terminals D of the flip-flops 370-0 to 370-7, the internal read command MDRDT is commonly input from the multiplexer 360. Incidentally, while the internal read command MDRDT is input via the delay circuit 361 and multiplexer 360 shown in FIG. 7, the delay circuit 361 and multiplexer 360 are not shown in FIG. 14. To the clock terminals CK, the input gate signals CIT0 to CIT7 are input. The signals output from the output terminals Q of the flip-flops 370-0 to 370-7 turn out to be the internal read commands DRCa0 to DRCa7, respectively.

Similarly, the output selection circuit 380 includes eight flip-flops 380-0 to 380-7 (third flip-flops). To input terminals D of the flip-flops 380-0 to 380-7, the internal read commands DRCb0 to DRCb7 are respectively supplied from the shift circuit 320. To the clock terminals CK, the output gate signals COT0 to COT7 are input. The signals output from the output terminals Q of the flip-flops 380-0 to 380-7 are combined before being supplied to one input end of an AND gate circuit 354 of the output combining circuit 350.

The flip-flops 370-0 to 370-7 and 380-0 to 380-7 are D-type flip-flops of an edge-triggered type. Accordingly, the flip-flops 370-0 to 370-7 and 380-0 to 380-7 have the following characteristic: the value of an input terminal D at a rise edge of a clock terminal CK is output from an output terminal Q, and the value is saved until the next rise edge of the clock terminal CK. The flip-flops 370-0 to 370-7 and 380-0 to 380-7 each have a reset terminal RST, and are so formed that an output terminal Q can be reset to a low level as a predetermined reset signal is supplied to the reset terminal RST.

Because of the above-described configuration of the command signal latch unit 300a, the outputting of read data DQ is realized in a similar way to that of the first embodiment. The following provides an explanation using the example of FIG. 12. Since the internal read command MDRDT is activated at a rise edge of the input gate signal CIT0, first the flip-flop 370-0 activates the internal read command DRCa0. In other words, the flip-flop 370-0 activates the internal read command DRCa0 that corresponds to the input gate signal CIT0 whose rise edge has arrived at a time when the internal read command MDRDT is being activated. In response, the shift circuit 320 activates the internal read command DRCb7. The active state of the above signals remains unchanged until the next rise edge of the input gate signal CIT0, as shown in FIG. 12.

In the example shown in FIG. 12, the active period of the internal read command MDRDT overlaps with not only the active period of the input gate signal CIT0 but also with the active period of the input gate signal CIT7 that appears one clock before the input gate signal CIT0. The above situation is the same as that in the example of FIG. 10. However, in the example of FIG. 12, unlike the example of FIG. 10, the internal read command DRCa7 is not activated. The above is an advantageous effect achieved by a process of accepting the internal read command MDRDT at a rise edge of the input gate signal.

If the output gate signal COT7 becomes activated during the activation of the internal read command DRCb7, then the output terminal Q of the flip-flop 370-7 becomes activated. The active state thereof is maintained until the next rise edge of the output gate signal COT7, as shown in FIG. 12. The output signals of the flip-flops 380-0 to 380-7 are combined before being supplied to the output combining circuit 350. That is, to the output combining circuit 350, when one of the output signals of the flip-flops 380-0 to 380-7 is at a high level, a high level is supplied; when all the output signals are at a low level, a low level is supplied.

In response to the activation of the output terminal Q of the flip-flop 380-7, the output combining circuit 350 generates an internal read command DRC, which is repeatedly activated and deactivated at intervals of 1tCK. The details about the operation of the output combining circuit 350 have been described in the first embodiment. The generated internal read command DRC is supplied to the FIFO circuit 75, which is shown in FIG. 1, thereby specifying the output timing of read data DQ.

As described above, the semiconductor device 10 of the present embodiment is designed to accept the internal read command MDRDT at a rise edge of the input gate signal. Therefore, it is possible to prevent the malfunction of the latency counter 55 resulting from the activation period of the internal read command MDRDT that is longer than 0.5tCK.

Figure 15:
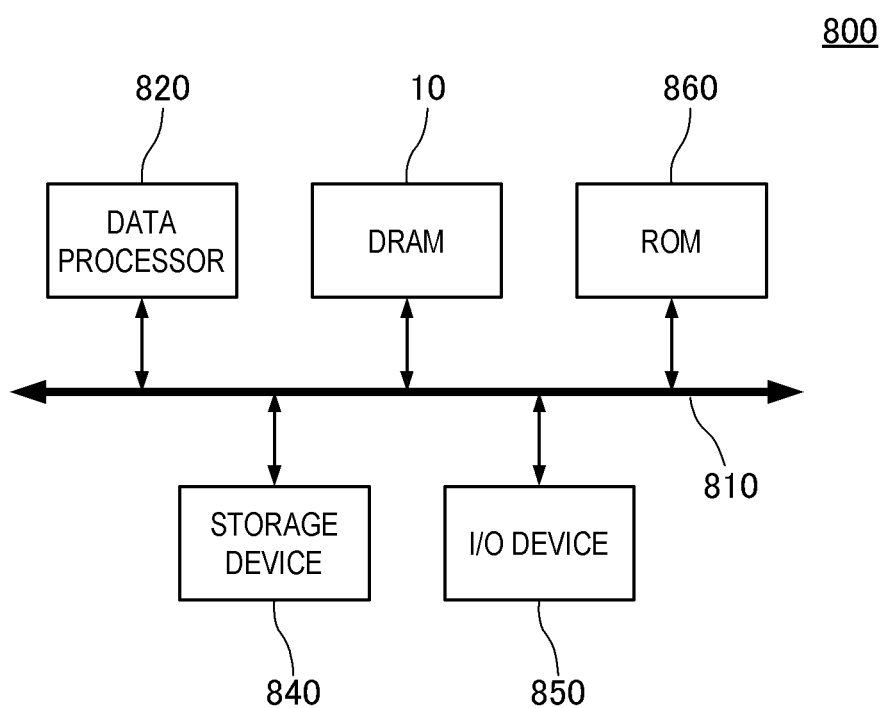
FIG. 15 is a block diagram showing the configuration of a data processing system 800 that uses the semiconductor device 10 of the present embodiments.

Turning to FIG. 15, the data processing system 800 includes a structure in which the following components are connected to each other via a system bus 810: a data processor 820 (controller); a DRAM 10, which is the semiconductor device 10 of one of the present embodiments; a storage device 840; an I/O device 850; and a ROM 860.

The data processor 820 includes a function of supplying external clock signals CK and/CK to the DRAM 10, and a function of receiving an output signal (read data DQ) of the data input/output circuit (FIG. 1) of the DRAM 10 and performing a process corresponding to the received read data DQ. More specifically, for example, the following can be used as the data processor 820: a microprocessor (MPU), a digital signal processor (DSP), and the like. Incidentally, the data processor 820 and the DRAM 10 may be connected to each other by a local bus, not via the system bus 810.

As the storage device 840, a hard disk drive, an optical disc drive, a flash memory, or the like may be used. As the I/O device 850, a display device such as a liquid crystal display, an input device such as a keyboard and mouse, or the like may be used. Incidentally, the I/O device 850 may be either an input device or an output device.

FIG. 15 shows only one system bus 810 for ease of explanation. However, a plurality of system buses 810 may be provided in a serial or parallel manner via a connector or the like, if necessary. The storage device 840, the I/O device 850, and the ROM 860 are not necessarily essential components. Furthermore, in FIG. 15, for ease of explanation, there is only one depicted per each type of component. However, the present invention is not limited to the above case. As for one, two, or more types of component, there may be provided more than one per type.

It is apparent that the present invention is not limited to the above embodiments, but may be modified and changed without departing from the scope and spirit of the invention.

For example, according to each of the above embodiments, the delay circuit 200 includes three delay elements D1 to D3. However, a delay circuit may be added to cause a delay equivalent to the amount of signal delay in an input stage of the read command READ (the command input circuit 31 or the like).

According to each of the above embodiments, the internal clock signal output from the DLL circuit 23 is divided into the following two types: the internal clock signal LCLKOET and the internal clock signal LCLKOEFT. However, one internal clock signal LCLK may be substituted for the above two.

Each of the above embodiments is explained on the assumption that the data input/output circuit 78 includes a plurality of unit buffers. However, the data input/output circuit 78 may have only one unit buffer.

Supplementary notes will be given below, because the semiconductor device of the present invention can be formed in the following manner.

According to another aspect of the present invention, a first semiconductor device is characterized by including a latency counter that generates a second internal read command after receiving a first internal clock signal, which is generated based on an external clock signal, and a first internal read command, which is generated in accordance with a read command supplied from outside, wherein the latency counter includes: a gate control signal generation unit that generates a plurality of output gate signals, which are sequentially activated in response to each clock of the first internal clock signal; a delay circuit unit that generates a plurality of input gate signals by delaying each of the plurality of output gate signals; and a command signal latch unit that generates the second internal read command in response to the next activation of one of the plurality of output gate signals that are associated with one input gate signal that is among the plurality of input gate signals and changes from a first logic level to a second logic level during a first period when the first internal read command is being activated, and does not generate the second internal read command even after the next activation of a plurality of output gate signals that are associated with a remaining input gate signal that is among the plurality of input gate signals and remains at the first or second logic level during the first period or changes from the second logic level to the first logic level during the first period.

According to another aspect of the present invention, a second semiconductor device is characterized in that the first internal read command in the first semiconductor device becomes activated for a longer period of time than half the cycle of the first internal clock signal.

According to another aspect of the present invention, a third semiconductor device is characterized in that: the gate control signal generation unit in the first or second semiconductor device includes a plurality of first flip-flops, which are connected in cascade with a final-stage output terminal connected to a first-stage input terminal; the first internal clock signal is commonly supplied to clock terminals of the plurality of first flip-flops; and the plurality of output gate signals are taken out from the output terminals of the corresponding first flip-flops.

According to another aspect of the present invention, a fourth semiconductor device is characterized in that: the command signal latch unit in one of the first to third semiconductor devices includes a plurality of second flip-flops, which are so provided as to correspond to the plurality of input gate signals and whose clock terminals are supplied with the corresponding input gate signals and whose input terminals are supplied with the first internal read command, a plurality of third flip-flops, which are so provided as to correspond to the plurality of output gate signals and whose clock terminals are supplied with the corresponding output gate signals, and a shift circuit, which supplies output signals of the plurality of second flip-flops to the plurality of third flip-flops in accordance with a preset latency; and the second internal read command is generated by combining output signals of the plurality of third flip-flops.

What is claimed is:

1. A semiconductor device comprising:
   a command decoder generating a first internal command in response to a first internal clock signal; and
   a latency counter that includes:
   a gate control signal generation unit generating a plurality of output gate signals in response to a second internal clock signal that is different from the first internal clock signal;
   a plurality of delay circuits each receiving an associated one of the output gate signals and generating an associated one of a plurality of input gate signals, each of the delay circuits including a first delay element that operates on a first power supply voltage and a second delay element that operates on a second power supply voltage, the first power supply voltage being different from the second power supply voltage; and
   a command signal latch unit fetching the first internal command in response to one of the input gate signals and outputting the first internal command as a second internal command in response to one of the output gate signals.

2. The semiconductor device as claimed in claim 1, wherein each of the first and second internal commands includes an internal read command.

3. The semiconductor device as claimed in claim 1, further comprising a first clock generation circuit generating the second internal clock signal and including a first circuit portion that operates on the first power supply voltage and a second circuit portion that operates on the second power supply voltage, and wherein the first delay element has a delay time that is substantially equal to a delay time of the first circuit of the first clock generation circuit.

4. The semiconductor device as claimed in claim 2, wherein the second delay element has a delay time that is substantially equivalent to a delay time of the second circuit of the first clock generation circuit.

5. The semiconductor device as claimed in claim 3, wherein the first clock generation circuit includes a DLL circuit.

6. The semiconductor device as claimed in claim 1, wherein the second internal clock signal leads in phase to the first internal clock signal.

7. The semiconductor device as claimed in claim 6, further comprising:
   a clock terminal supplied with an external clock signal,
   a first clock generation circuit generating the first internal clock signal in response to the external clock signal, and
   a second clock generation circuit generating the second internal clock signal in response to the external clock signal.

8. The semiconductor device as claimed in claim 1, the first and second delay elements of each of the delay circuits are coupled in series to each other.

9. The semiconductor device as claimed in claim 1, wherein each of the delay circuits further includes a third delay element operating on the second power supply voltage.

10. The semiconductor device as claimed in claim 9, wherein the first to third delay elements of each of the delay circuits are coupled in series to each other.

11. The semiconductor device as claimed in claim 1, further comprising:
   a first power supply terminal externally supplied with the first power supply voltage, and
   a voltage generation circuit generating the second power supply voltage in response to the first power supply voltage.

12. The semiconductor device as claimed in claim 11, wherein the voltage generation circuit includes a regulator circuit.

13. The semiconductor device as claimed in claim 1, wherein the command decoder operates on the second power supply voltage.

14. The semiconductor device as claimed in claim 12, wherein the first power supply voltage is greater in voltage level than the second power supply voltage.

15. The semiconductor device as claimed in claim 1, further comprising:
   a memory cell array storing data; and
   an output unit receiving the data from the memory cell array in response to the second internal command and outputting the data in response to a third internal clock signal.

16. The semiconductor device as claimed in claim 15, wherein the second and third internal clock signals are substantially equal in phase to each other.

17. A semiconductor device comprising:
   a command decoder operating on an internal power supply voltage and generating a first internal command;
   a clock generating circuit generating a first internal clock signal and including a first circuit portion that operates on the internal power supply voltage and a second circuit portion that operates on an external power supply voltage; and
   a latency counter that includes:
   a gate control signal generation unit generating a plurality of output gate signals in response to the first internal clock signal;
   a plurality of delay circuits each receiving an associated one of the output gate signals and generating an associated one of a plurality of input gate signals, each of the delay circuits having a delay time that changes in response to variations of both of the internal and external power supply voltages; and
   a command signal latch unit fetching the first internal command in response to one of the input gate signals and outputting the first internal command as a second internal command in response to one of the output gate signals.

18. The semiconductor device as claimed in claim 17, wherein each of the first and second internal commands includes an internal read command.

19. The semiconductor device as claimed in claim 17, wherein the clock generating circuit includes a DLL circuit.

20. The semiconductor device as claimed in claim 17, further comprising:
   a memory cell array storing data; and
   an output unit receiving the data from the memory cell array in response to the second internal command and outputting the data in response to a second internal clock signal.

* * * * *